(12) United States Patent
Kinoshita et al.

(10) Patent No.: US 6,686,782 B2
(45) Date of Patent: Feb. 3, 2004

(54) POWER SUPPLY VOLTAGE DETECTION CIRCUIT

(75) Inventors: Masayoshi Kinoshita, Osaka (JP); Jun Kajiwara, Kyoto (JP); Shiro Sakiyama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 43 days.

(21) Appl. No.: 10/053,552

(22) Filed: Jan. 24, 2002

(65) Prior Publication Data

US 2002/0101263 A1 Aug. 1, 2002

(30) Foreign Application Priority Data

Feb. 1, 2001 (JP) ........................................ 2001-025806

(51) Int. Cl.[7] .......................... H03K 17/22; H03K 5/153
(52) U.S. Cl. ........................... 327/143; 327/77; 327/307
(58) Field of Search ............................... 327/77, 80, 81, 327/143, 198, 307, 362

(56) References Cited

U.S. PATENT DOCUMENTS

| 5,748,548 | A |   | 5/1998  | Padoan et al. ............... 365/226 |
| 5,994,888 | A | * | 11/1999 | Yanagawa .................... 327/143 |
| 6,147,521 | A | * | 11/2000 | Degoirat et al. ............... 327/81 |
| 6,163,183 | A | * | 12/2000 | Azimi et al. ................. 327/143 |

FOREIGN PATENT DOCUMENTS

JP  59-137645  9/1984

* cited by examiner

Primary Examiner—Toan Tran
(74) Attorney, Agent, or Firm—McDermott, Will & Emery

(57) ABSTRACT

A power supply voltage detection circuit includes a voltage division circuit for linearly dividing a power supply voltage, a reference voltage circuit for providing a reference voltage, and a comparison circuit for comparing the output voltage from the voltage division circuit and the reference voltage from the reference voltage circuit. The power supply voltage detection circuit outputs a signal upon detecting that the power supply voltage is equal to or higher than the reference voltage. A PMOS transistor is provided between the voltage division circuit and the comparison circuit. The PMOS transistor includes a source terminal connected to an output terminal of the voltage division circuit, a drain terminal connected to an input terminal of the comparison circuit, and a gate terminal connected to the ground. Until the output voltage from the comparison circuit is higher than the threshold voltage of the PMOS transistor, the PMOS transistor remains OFF, thereby canceling the input of the output voltage signal from the voltage division circuit to the comparison circuit. Thus, without using external components, the signal is prevented from being erroneously output due to the output voltage from the voltage division circuit rising over, without crossing, the reference voltage from the reference voltage circuit during a sharp rise of the power supply voltage.

4 Claims, 22 Drawing Sheets

POWER SUPPLY VOLTAGE DETECTION CIRCUIT

BACKGROUND OF THE INVENTION

The present invention relates to a power supply voltage detection circuit for outputting a signal upon detecting a power supply voltage, and more particularly to an improvement thereon for preventing the signal from being erroneously output due to a sharp rise of the power supply voltage.

Referring to FIG. 19 and FIG. 20, a power supply voltage detection circuit 103 designed to detect a power supply voltage based on a predetermined voltage is typically used as a reset signal generation circuit for an arithmetic circuit 102 in a semiconductor integrated circuit 101, for example. Typically, when the power supply voltage is lower than or equal to a predetermined voltage Vo, the power supply voltage detection circuit 103 determines that the power supply voltage is not detected and thus outputs a 'not detected' signal to inactivate the arithmetic circuit 102, whereas when the power supply voltage is higher than the predetermined voltage Vo, the power supply voltage detection circuit 103 determines that the power supply is detected and thus outputs a 'detected' signal to activate the arithmetic circuit 102. In this way, the semiconductor integrated circuit 101 is operated properly.

Referring to FIG. 21, the power supply voltage detection circuit 103 includes a voltage division circuit 130 for outputting a signal of an output voltage A, a reference voltage circuit 131 for outputting a signal of a reference voltage B, and a comparison circuit 132 for comparing the output voltage A from the voltage division circuit 130 with the reference voltage B from the reference voltage circuit 131. The voltage division circuit 130 includes two resistors 113 serially connected between the power supply terminal and the ground terminal for linearly dividing the power supply voltage so as to output the output voltage A, which is the voltage at the division point. Since the output voltage A from the voltage division circuit 130 is a voltage obtained through a resistance-based division of the power supply voltage, the output voltage A changes in proportion to the power supply voltage, as illustrated in FIG. 22A. On the other hand, the reference voltage B from the reference voltage circuit 131 is defined to be equal to the output voltage A when the power supply voltage is equal to the predetermined voltage Vo, and the reference voltage B in its steady state is constant irrespective of the power supply voltage. Typically, when the output voltage A is lower than or equal to the reference voltage B, based on the comparison at the comparison circuit 132, it is determined that the power supply voltage is lower than or equal to the predetermined voltage Vo so as to output the 'not detected' signal (low signal L in the illustrated example), whereas when the output voltage A is higher than the reference voltage B, it is determined that the power supply voltage is higher than the predetermined voltage Vo so as to output the 'detected' signal (high signal H in the illustrated example). Thus, the waveform of the output voltage A and the waveform of the reference voltage B cross each other at a position where the power supply voltage is equal to the predetermined voltage Vo so as to form an intersection at the crossing point, so that the output signal is switched from one to another when crossing the intersection.

While the reference voltage circuit 131 is typically designed to output a reference voltage signal simultaneously with the rise of the power supply voltage, it takes a certain amount of time that is determined by the circuit configuration of the reference voltage circuit 131 before the reference voltage circuit 131 starts outputting a stable, constant reference voltage B. For example, where a band gap reference circuit is used as the reference voltage circuit 131, it takes a certain amount of time that is determined by the feedback circuit before the band gap reference circuit starts outputting a stable, constant voltage signal. If the power supply voltage rises sharply, the output voltage A may rise over, without crossing, the reference voltage B, thus forming no intersection between the waveform of the output voltage A and the waveform of the reference voltage B, as illustrated in FIG. 22B. In such a case, the power supply voltage detection circuit 103 always outputs the 'detected' signal (high signal H) without outputting the 'not detected' signal (low signal L), thereby failing to reset the semiconductor integrated circuit 101.

In the prior art, this problem has been addressed by adding a resistor 104 and a capacitor 105 to the power supply terminal external to the semiconductor integrated circuit 101, as illustrated in FIG. 19, or by adding a capacitor 105 having a large capacitance to the power supply terminal external to the semiconductor integrated circuit 101, as illustrated in FIG. 20. In this way, even when the power supply voltage rises sharply, the rise of the power supply voltage is gentle for the power supply voltage detection circuit 103 in the semiconductor integrated circuit 101, thereby ensuring that the 'not detected' signal (low signal L) is output when appropriate.

However, when the resistor 104 and/or the capacitor 105 are provided external to the circuit, as in the conventional power supply voltage detection circuit 103, those external components increase the system cost and the mounting area.

SUMMARY OF THE INVENTION

An object of the present invention is to provide a power supply voltage detection circuit for outputting a signal upon detecting the power supply voltage by comparing, at a comparison circuit, an output voltage from a voltage division circuit with a reference voltage from a reference voltage circuit, with an improvement being made to the inside of the circuit such that it is ensured that a 'not detected' signal is output when appropriate even when the power supply voltage rises sharply, without using external components which would otherwise increase the system cost and the mounting area.

In order to achieve the object, in one embodiment of the present invention, a signal to be input from the voltage division circuit to the comparison circuit is canceled or delayed until the power supply voltage reaches a predetermined voltage during the rise of the power supply voltage. Alternatively, in one embodiment of the present invention, the operation speed of the voltage division circuit is suppressed so as to slow down the rise of the output voltage. Alternatively, in one embodiment of the present invention, the unstable state of the reference voltage during the rise of the power supply voltage is utilized, by fixing the output signal of the power supply voltage detection circuit itself while the reference voltage is unstable.

Specifically, in one embodiment of the present invention, a power supply voltage detection circuit includes a voltage division circuit, a reference voltage circuit and a comparison circuit, wherein a second voltage is predetermined, and the power supply voltage detection circuit further includes signal cancellation means for canceling an input of an output voltage signal from the voltage division circuit to the comparison circuit when the power supply voltage is lower than the second voltage, while not canceling the input of the output voltage signal when the power supply voltage is higher than the second voltage.

In this way, during the rise of the power supply voltage, even if there is a period in which the input voltage from the voltage division circuit to the comparison circuit is lower than the reference voltage from the reference voltage circuit, whereby the output voltage from the voltage division circuit rises over, without crossing, the reference voltage during a sharp rise of the power supply voltage, the input voltage at the comparison circuit rises gently. Therefore, it is ensured that a 'not detected' signal is output when appropriate. When the power supply voltage is higher than the second voltage, the cancellation operation by the signal cancellation means is stopped, whereby a 'detected' signal is output as the power supply voltage rises. During the fall of the power supply voltage, an appropriate signal is output according to the power supply voltage.

In one embodiment of the present invention, it is determined that the power supply voltage is detected based on the first voltage when the power supply voltage is higher than the first voltage, while it is determined that the power supply voltage is not detected when the power supply voltage is lower than the first voltage, though the determination generally depends on the conditions of the circuit that is to receive the output signal from the power supply voltage detection circuit. The second voltage can be determined within a range which includes the first voltage and whose upper limit is the practical maximum value of the power supply voltage, according to the conditions of the circuit that is to receive the output signal from the power supply voltage detection circuit. However, it is preferred that the second voltage is close to the first voltage so as to facilitate the design of the circuit that is to receive the output signal from the power supply voltage detection circuit.

In one embodiment of the present invention, the power supply voltage detection circuit determines that the power supply voltage is not detected when the input voltage from the voltage division circuit to the comparison circuit is lower than or equal to the reference voltage from the reference voltage circuit, while determining that the power supply voltage is detected when the input voltage is higher than the reference voltage, wherein a PMOS transistor is provided between the voltage division circuit and the comparison circuit, the PMOS transistor including a source terminal connected to an output terminal of the voltage division circuit, a drain terminal connected to an input terminal of the comparison circuit, and a gate terminal connected to a power supply. The signal cancellation means is provided by the PMOS transistor.

In this way, during the rise of the power supply voltage, until the output voltage is higher than the threshold voltage of the PMOS transistor, i.e., until the power supply voltage is higher than the second voltage, the source-drain connection of the PMOS transistor is OFF, whereby the output voltage signal from the voltage division circuit is not passed to the comparison circuit. On the other hand, when the output voltage is higher than the threshold voltage, the source-drain connection of the PMOS transistor is ON, whereby the output voltage signal is input to the comparison circuit as in a case where the PMOS transistor is absent.

In one embodiment of the present invention, signal delay means for delaying the output voltage signal to be input from the voltage division circuit to the comparison circuit is provided instead of the signal cancellation means. In this way, the input voltage from the voltage division circuit to the comparison circuit rises gently. Thus, even when the power supply voltage rises sharply and the output voltage from the voltage division circuit rises over, without crossing, the reference voltage from the reference voltage circuit, the input voltage rises gently due to the delay on the output voltage signal. Therefore, it is ensured that the 'not detected' signal is output when appropriate.

In one embodiment of the present invention, the power supply voltage detection circuit includes delay cancellation means for canceling the delay operation of the signal delay means when the power supply voltage is higher than the second voltage. In this way, during the fall of the power supply voltage that starts with the power supply voltage being higher than the second voltage, it is possible to prevent the response speed from decreasing due to the delay on the output voltage signal by the signal delay means.

In one embodiment of the present invention, voltage change suppression means for suppressing the rate of change of the output voltage from the voltage division circuit is provided instead of the signal cancellation means and the signal delay means. In this way, even when the power supply voltage rises sharply, the output voltage rises gently.

In one embodiment of the present invention, the power supply voltage detection circuit includes suppression cancellation means for canceling the suppression operation of the voltage change suppression means when the power supply voltage is higher than the second voltage. In this way, during the fall of the power supply voltage that starts with the power supply voltage being higher than the second voltage, it is possible to prevent the response speed from decreasing due to the suppression of the rate of change of the output voltage by the voltage change suppression means.

In one embodiment of the present invention, the power supply voltage detection circuit includes a capacitor and a switch as the voltage change suppression means and the suppression cancellation means, respectively. The capacitor and the switch are provided in series between the output terminal of the voltage division circuit and the second power supply. When the power supply voltage is lower than the second voltage, the switch is turned ON to charge the capacitor so as to suppress the rate of change of the output voltage. When the power supply voltage is higher than the second voltage, the switch is turned OFF to cancel the capacitor charging operation so as to allow the output voltage to change in proportion to the power supply voltage.

In one embodiment of the present invention, the power supply voltage detection circuit is designed so that the second voltage, based on which the voltage change suppression means is activated/inactivated by the suppression cancellation means, is equal to the predetermined first voltage, which is the threshold value for the detection of the power supply voltage by the power supply voltage detection circuit. In this way, the need for a special-purpose circuit for generating the second voltage is eliminated, thereby reducing the circuit scale accordingly.

In one embodiment of the present invention, the power supply voltage detection circuit determines that the power supply voltage is not detected when the output voltage is lower than or equal to the reference voltage, while determining that the power supply voltage is detected when the output voltage is higher than the reference voltage. Utilizing the fact that the output voltage and the reference voltage are equal to each other in the beginning of the rise of the power supply voltage, the voltage change suppression means is provided by a capacitor connected between the output terminal of the voltage division circuit and the second power supply, and the suppression cancellation means is provided by a switch connected in series with the capacitor between the output terminal of the voltage division circuit and the second power supply, wherein the switch is turned ON/OFF by the output of the comparison circuit, i.e., the output of the power supply voltage detection circuit. Specifically, the switch is turned ON by a 'not detected' signal (e.g., a low signal) that is generated when the output voltage is lower than or equal to the reference voltage, and turned OFF by a 'detected' signal (e.g., a high signal) that is generated when the output voltage is higher than the reference voltage.

In this way, in the beginning of the rise of the power supply voltage, the output voltage and the reference voltage are equal to each other and thus the switch is ON, thereby charging the capacitor so as to suppress the rate at which the output voltage from the voltage division circuit rises. On the other hand, in the beginning of the fall of the power supply voltage, the output voltage is higher than the reference voltage and thus the switch is OFF, thereby allowing the output voltage to change in proportion to the power supply voltage.

In one embodiment of the present invention, an unstable state of the reference voltage during the rise of the power supply voltage is utilized. Specifically, instead of the signal cancellation means, the signal delay means and the voltage change suppression means, the power supply voltage detection circuit includes a reference voltage determination circuit for determining whether or not the reference voltage is in a stable state in which the reference voltage is a constant voltage, so as to output a 'reference unstable' signal when it is determined that the reference voltage is not in the stable state and a 'reference stable' signal when it is determined that the reference voltage is in the stable state. The power supply voltage detection circuit further includes output fixing means for fixing the output signal of the power supply voltage detection circuit to a signal that indicates that the power supply voltage is not detected, when the 'reference unstable' signal is received from the reference voltage determination circuit, while not fixing the output signal when the 'reference stable' signal is received from the reference voltage determination circuit.

In this way, while the reference voltage is in the unstable state during the rise of the power supply voltage, the output signal is fixed to the 'not detected' signal, whereby it is ensured that the 'not detected' signal is output when appropriate even when the power supply rises sharply. During the fall of the power supply voltage in which the reference voltage is in the stable state, a high response speed as that achieved in the absence of the output fixing means is maintained. In addition, even when the power supply voltage rises gently, it is possible to prevent the 'detected' signal from being erroneously output due to an unstable state of the reference voltage that causes the output voltage to rise over, without crossing, the reference voltage.

In one embodiment of the present invention, the output fixing means is provided by a switch connected between the comparison circuit and a power supply for the comparison circuit. The switch is turned OFF by the 'reference unstable' signal so as to cut off the power supply to the comparison circuit and to pull down the output of the comparison circuit, thereby fixing the output signal to the low signal, i.e., the 'not detected' signal indicating that the power supply voltage is not detected.

In one embodiment of the present invention, a switch, as the output fixing means, is provided between the output terminal of the voltage division circuit and the second power supply, wherein the switch is turned OFF by the 'reference unstable' signal so as to short-circuit the output terminal of the voltage division circuit to the second power supply, thereby pulling down the output from the voltage division circuit and thus fixing the output signal.

In one embodiment of the present invention, a switch, as the output fixing means, is provided between the voltage division circuit and the first power supply, wherein the switch is turned OFF by the 'reference unstable' signal, thereby pulling down the output from the voltage division circuit and thus fixing the output signal to the low signal.

DETAILED DESCRIPTION OF THE INVENTION

Preferred embodiments of the present invention will now be described with reference to the accompanying drawings.

Embodiment 1

Figure 1:
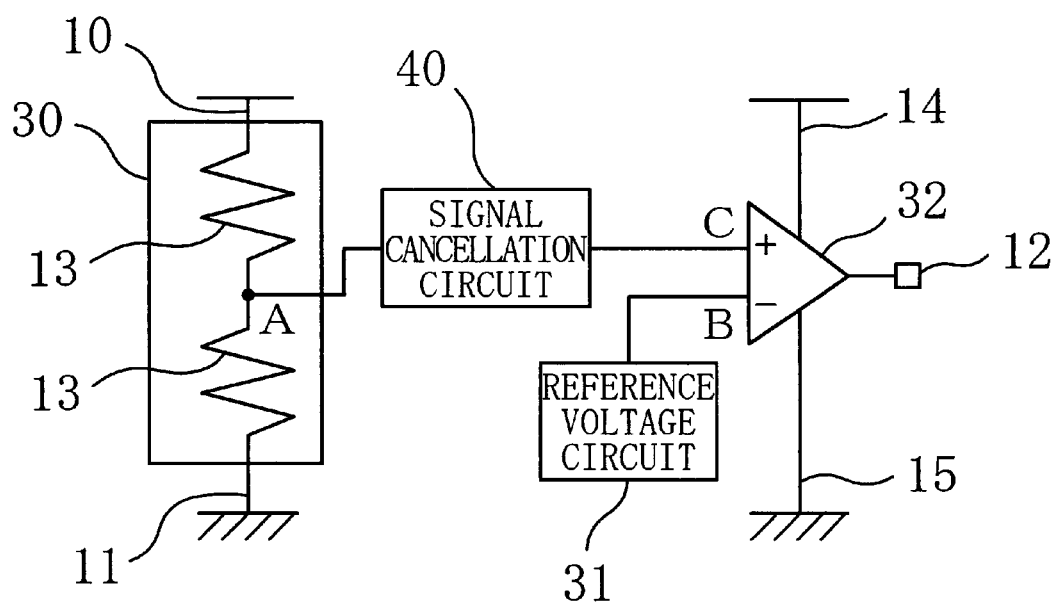
FIG. 1 is a circuit diagram illustrating a general configuration of a power supply voltage detection circuit according to Embodiment 1 of the present invention.

FIG. 1 illustrates a general configuration of a power supply voltage detection circuit 3 according to Embodiment 1 of the present invention.

Figure 2:
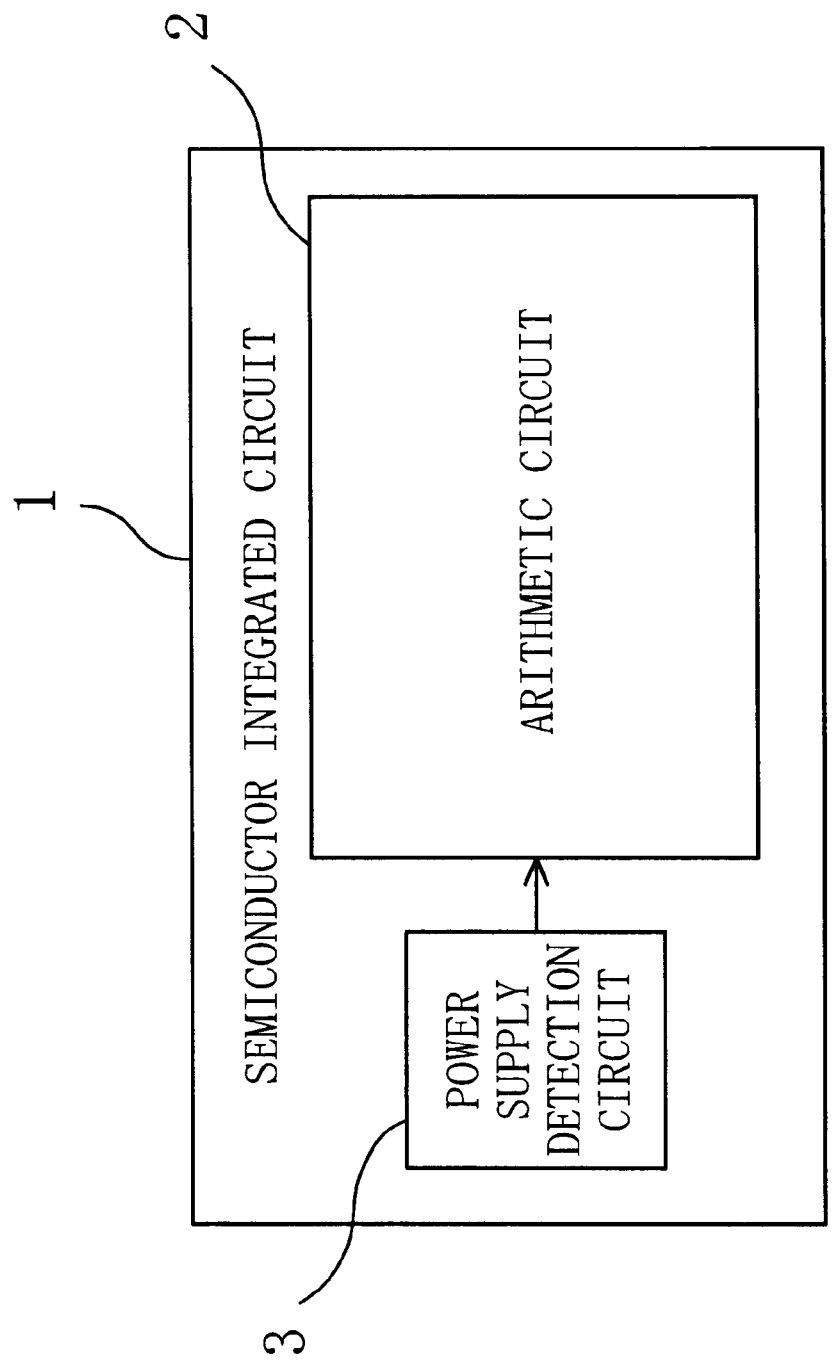
FIG. 2 is a circuit diagram illustrating a configuration of a semiconductor integrated circuit incorporating the power supply voltage detection circuit.

Referring to FIG. 2, the power supply voltage detection circuit 3 is provided in a semiconductor integrated circuit 1 and is designed so as to detect the power supply voltage being equal to or higher than a predetermined first voltage (i.e., detect the power supply voltage). The power supply voltage detection circuit 3 is used as a reset signal generation circuit for an arithmetic circuit 2. When the power supply voltage is lower than or equal to the first voltage, the power supply voltage detection circuit 3 outputs a 'not detected' signal to inactivate the arithmetic circuit 2, whereas when the power supply voltage is higher than the first voltage, the power supply voltage detection circuit 3 outputs a 'detected' signal to activate the arithmetic circuit 2.

The power supply voltage detection circuit 3 includes a power supply terminal 10 connected to a first power supply, a ground terminal 11 connected to the ground as a second power supply, and an output terminal 12 for outputting a signal. The power supply voltage detection circuit 3 further includes a voltage division circuit 30 for outputting a signal of an output voltage A that is obtained by linearly dividing the power supply voltage applied between the power supply terminal 10 and the ground terminal 11, a reference voltage circuit 31 for outputting a signal of a reference voltage B that is defined to be equal to the output voltage A when the power supply voltage is equal to the first voltage, and a comparison circuit 32 for comparing an input voltage C with the reference voltage B of the reference voltage signal received from the reference voltage circuit 31. The input voltage C is the voltage of the output voltage signal received from the voltage division circuit 30. When the input voltage C is lower than or equal to the reference voltage B, the comparison circuit 32 determines that the power supply voltage is not detected and thus outputs a low signal L as the 'not detected' signal, whereas when the input voltage C is higher than the reference voltage B, the comparison circuit 32 determines that the power supply is detected and thus outputs a high signal H as the 'detected' signal.

Specifically, the voltage division circuit 30 includes two resistors 13 serially connected between the power supply terminal 10 and the ground terminal 11, and an output terminal provided between the two resistors 13, for linearly dividing the power supply voltage applied between the power supply terminal 10 and the ground terminal 11 by the resistors 13 so as to output, from the output terminal, a signal of the output voltage A at the division point.

Figure 3:
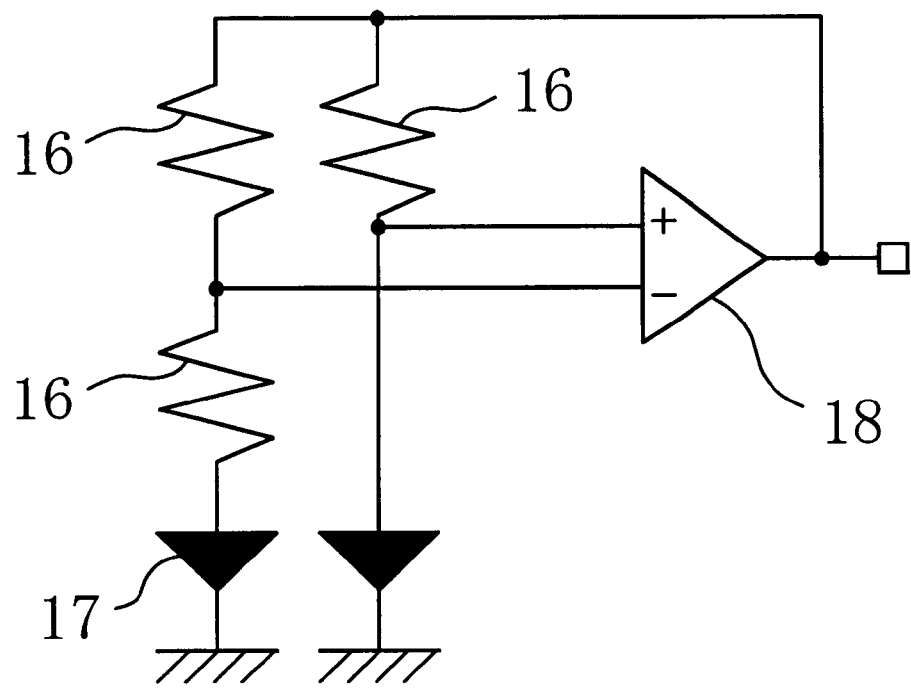
FIG. 3 is a circuit diagram illustrating an exemplary configuration of a reference voltage circuit provided in the power supply voltage detection circuit.

Referring to FIG. 3, the reference voltage circuit 31 is a band gap reference circuit including resistors 16, diodes 17 and an operational amplifier 18 that are connected to one another.

The comparison circuit 32 includes, on the input side thereof, an input terminal for receiving the output voltage signal from the voltage division circuit 30 and another input terminal for receiving the reference voltage signal from the reference voltage circuit 31, and the output side thereof is connected to the output terminal 12 of the power supply voltage detection circuit 3. The comparison circuit 32 is further provided with a power supply terminal 14 for driving the comparison circuit 32 and a ground terminal 15.

In the present embodiment, the power supply voltage detection circuit 3 further includes a signal cancellation circuit 40, as signal cancellation means, provided between the output terminal of the voltage division circuit 30 and one of the input terminals of the comparison circuit 32 that is provided for the voltage division circuit 30. The signal cancellation circuit 40 has a predetermined second voltage therein. When the power supply voltage is lower than or equal to the second voltage, the signal cancellation circuit 40 acts to prevent the output voltage signal from the voltage division circuit 30 from being transmitted to the one of the input terminals of the comparison circuit 32 that is provided for the voltage division circuit 30, whereas when the power supply voltage is higher than the second voltage, the signal cancellation circuit 40 allows the output voltage signal from the voltage division circuit 30 to be transmitted to the input terminal of the comparison circuit 32.

The operation of the power supply voltage detection circuit 3 having such a configuration will be described with reference to the voltage graphs of FIG. 4A and FIG. 4B. The output voltage A, which is the voltage at the node on the output side of the voltage division circuit 30, has a waveform such that the value thereof changes in proportion to the power supply voltage since it is obtained by linearly dividing the power supply voltage. In contrast, the reference voltage B, which is the voltage at the node on the output side of the reference voltage circuit 31, has a waveform such that it is not constant in an area where the power supply voltage is low because the reference voltage circuit 31 cannot operate in a region where the power supply voltage is low, but is constant irrespective of any change in the power supply voltage in a region where the power supply voltage is higher than a certain voltage. The input voltage C, which is the voltage at one of the input terminals of the comparison circuit 32 that is provided for the voltage division circuit 30, is at the ground level in a region where the power supply voltage is lower than or equal to the second voltage, i.e., where the signal cancellation circuit 40 is active, and is at the same potential as the output voltage A from the voltage division circuit 30 in a region where the power supply voltage is higher than the second voltage.

Figure 4A:
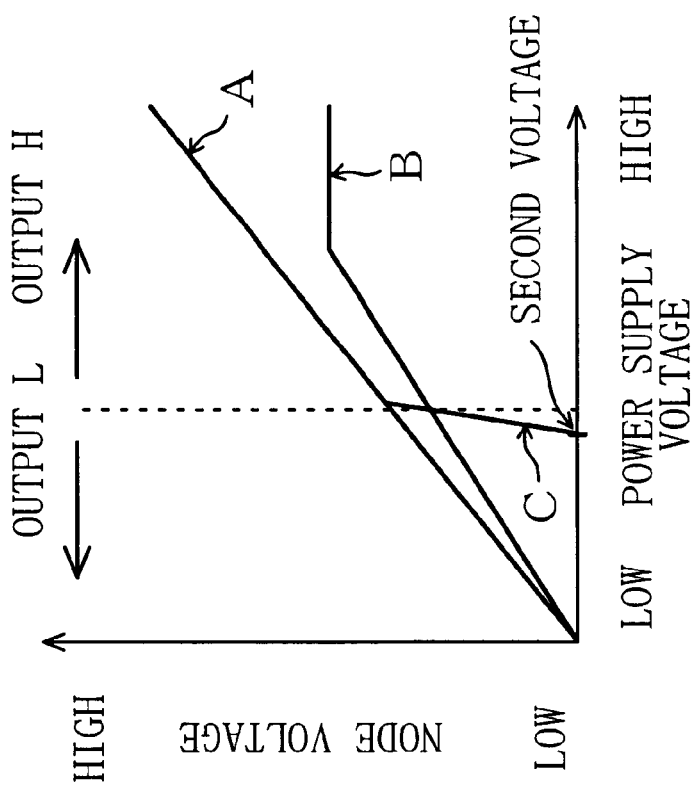
FIG. 4A is a graph illustrating an output voltage from a voltage division circuit, a reference voltage from a reference voltage circuit and an input voltage to a comparison circuit in a power supply voltage detection circuit of Embodiment 1 with respect to a gently-rising power supply voltage.
Figure 4B:
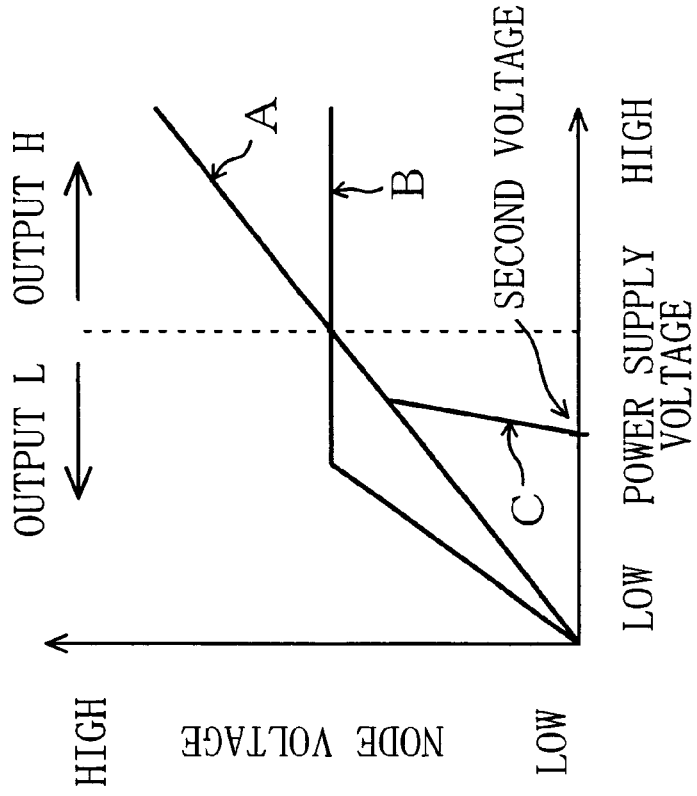
FIG. 4B is a graph illustrating an output voltage from a voltage division circuit, a reference voltage from a reference voltage circuit and an input voltage to a comparison circuit in the power supply voltage detection circuit with respect to a sharply-rising power supply voltage.

In a case where the power supply voltage rises slowly, as illustrated in FIG. 4A, the output voltage A rises with the waveform thereof crossing the waveform of the reference voltage B in a region where the reference voltage circuit 31 outputs a stable, constant reference voltage B. Therefore, when the power supply voltage is lower than or equal to the first voltage, the power supply voltage detection circuit 3 outputs the low signal L, whereas when the power supply voltage is higher than the first voltage, the power supply voltage detection circuit 3 outputs the high signal H. On the other hand, in a case where the power supply voltage rises sharply, as illustrated in FIG. 4B, the output voltage A rises over, without crossing, the reference voltage B, thus forming no intersection between the waveforms of the output voltage A and the reference voltage B. In such a case, a conventional configuration would always output the high signal H.

In contrast, with the present embodiment, an intersection is formed between the input voltage C to the comparison circuit 32, which is the output voltage A received from the voltage division circuit 30 via the signal cancellation circuit 40, and the reference voltage B from the reference voltage circuit 31, thereby ensuring that the power supply voltage detection circuit 3 outputs the low signal L when appropriate.

During the fall of the power supply voltage, the power supply voltage starts decreasing from a level higher than the second voltage and thus the output voltage signal is not delayed, whereby the power supply voltage detection circuit 3 operates normally to output an appropriate signal according to the characteristics shown in FIG. 4A irrespective of whether the power supply voltage has risen slowly or sharply.

Therefore, according to the present embodiment, it is possible to reliably output the low signal L when appropriate even when the power supply voltage rises sharply, while outputting an appropriate signal according to the power supply voltage during the fall of the power supply voltage, without using external components that would otherwise increase the system cost and the mounting area.

Embodiment 2

Figure 5:
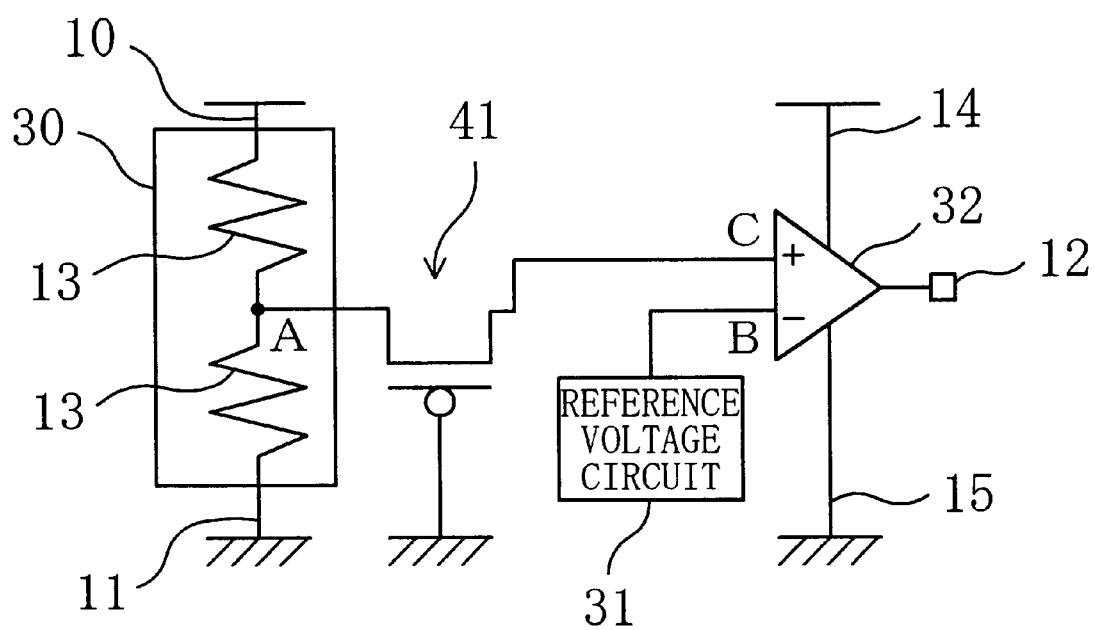
FIG. 5 is a circuit diagram illustrating a general configuration of a power supply voltage detection circuit according to Embodiment 2 of the present invention.

FIG. 5 illustrates a general configuration of the voltage division circuit 30 according to Embodiment 2 of the present invention, wherein those elements that are already introduced in Embodiment 1 will be denoted by the same reference numerals. The present embodiment is a specific example of Embodiment 1.

In the present embodiment, a PMOS transistor 41 is used as the signal cancellation circuit 40 of Embodiment 1. The PMOS transistor 41 includes a source terminal connected to the output terminal of the voltage division circuit 30, a drain terminal connected to one of the input terminals of the comparison circuit 32 that is provided for the voltage division circuit 30, and a gate terminal connected to the ground.

The PMOS transistor 41 has a threshold voltage Vtp so that no current flows between the source and the drain unless the gate-source voltage is higher than the threshold voltage Vtp. Therefore, the input of the output voltage signal from the voltage division circuit 30 to the comparison circuit 32 is canceled until the output voltage A from the voltage division circuit 30 is higher than the threshold voltage Vtp of the PMOS transistor 41, i.e., until the power supply voltage is higher than a voltage $Vtp*(1+R1/R2)$ (where R1 denotes the resistance value of one of the resistors 13 that is closer to the power supply terminal 10, and R2 denotes the other one of the resistors 13 that is closer to the ground terminal 11), whereby the power supply voltage is detected. On the other hand, when the power supply voltage is higher than the voltage $Vtp*(1+R1/R2)$, the source-drain connection is ON, whereby the output voltage signal is input to the comparison circuit 32 without being canceled.

Thus, according to the present embodiment, the second voltage in Embodiment 1 is set to $Vtp*(1+R1/R2)$ (the second voltage=$Vtp*(1+R1/R2)$). In this way, the effects of Embodiment 1 are realized concretely and appropriately.

While the gate terminal of the PMOS transistor 41 is connected to the ground in the present embodiment, the gate terminal may alternatively be connected to a terminal having a voltage Vpg, in which case the second voltage may be set to a voltage $Vtp*(1+R1/R2)+Vpg$ (the second voltage=$Vtp*(1+R1/R2)+Vpg$).

Embodiment 3

Figure 6:
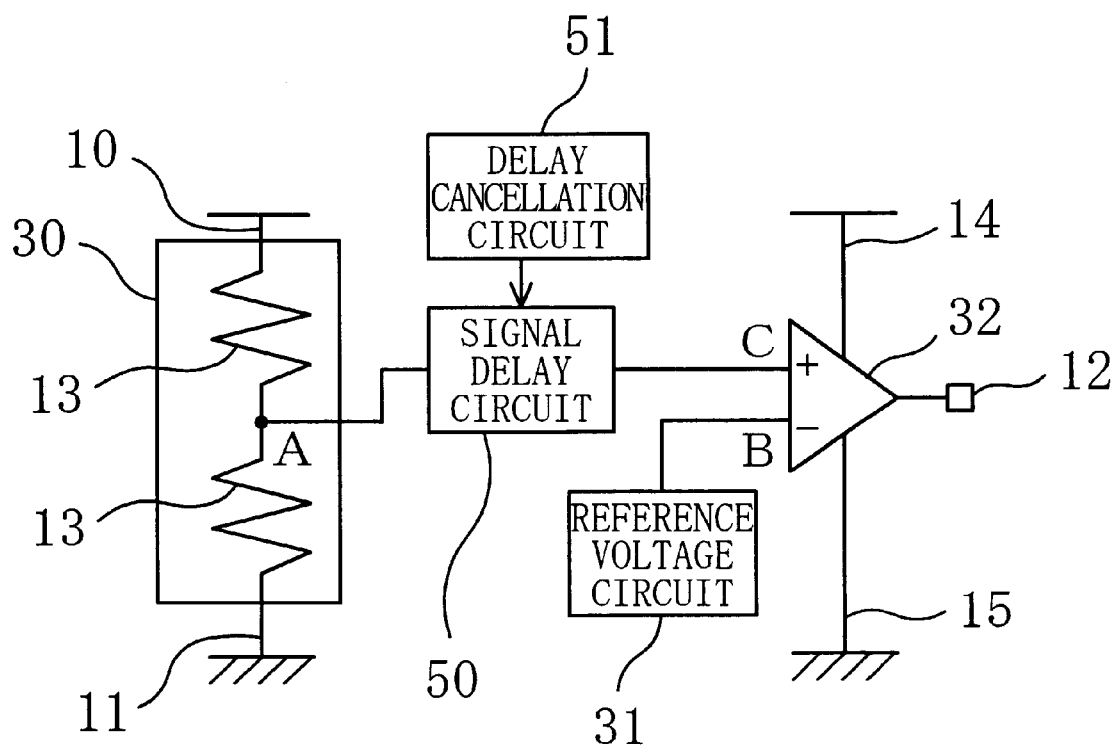
FIG. 6 is a circuit diagram illustrating a general configuration of a power supply voltage detection circuit according to Embodiment 3 of the present invention.

FIG. 6 illustrates a general configuration of the power supply voltage detection circuit 3 according to Embodiment 3 of the present invention, wherein those elements that are already introduced in Embodiment 1 will be denoted by the same reference numerals.

The power supply voltage detection circuit 3 of the present embodiment includes a signal delay circuit 50 and a delay cancellation circuit 51 in place of the signal cancellation circuit 40 of Embodiment 1. The signal delay circuit 50, as signal delay means, is provided between the output terminal of the voltage division circuit 30 and one of the input terminals of the comparison circuit 32 that is provided for the voltage division circuit 30. The delay cancellation circuit 51, as delay cancellation means, is provided for canceling the delay function of the signal delay circuit 50.

The signal delay circuit 50 is a circuit that acts to delay the output voltage signal to be input from the voltage division circuit 30 to the comparison circuit 32. The delay cancellation circuit 51 is a circuit that cancels the delay operation of the signal delay circuit 50, when the power supply voltage is higher than the second voltage, so that the output voltage signal from the voltage division circuit 30 is transmitted to the input terminal of the comparison circuit 32 without being delayed. Thus, when the power supply voltage is lower than or equal to the second voltage, the input of the output voltage signal to the comparison circuit 32 is delayed by the signal delay circuit 50, whereas when the power supply voltage is higher than the second voltage, the output voltage signal is input to the comparison circuit 32 without being delayed by the signal delay circuit 50. Other than this, the configuration of the voltage division circuit 30 is the same as that of Embodiment 1, and thus will not be further discussed below.

The operation of the power supply voltage detection circuit 3 having such a configuration will be described with reference to FIG. 7A and FIG. 7B. In a case where the power supply voltage rises slowly, as illustrated in FIG. 7A, the output voltage A rises with the waveform thereof crossing the waveform of the reference voltage B in a region where the reference voltage circuit 31 outputs a stable, constant reference voltage B, whereby the power supply voltage detection circuit 3 operates normally to output a signal of an appropriate value.

Figure 7:
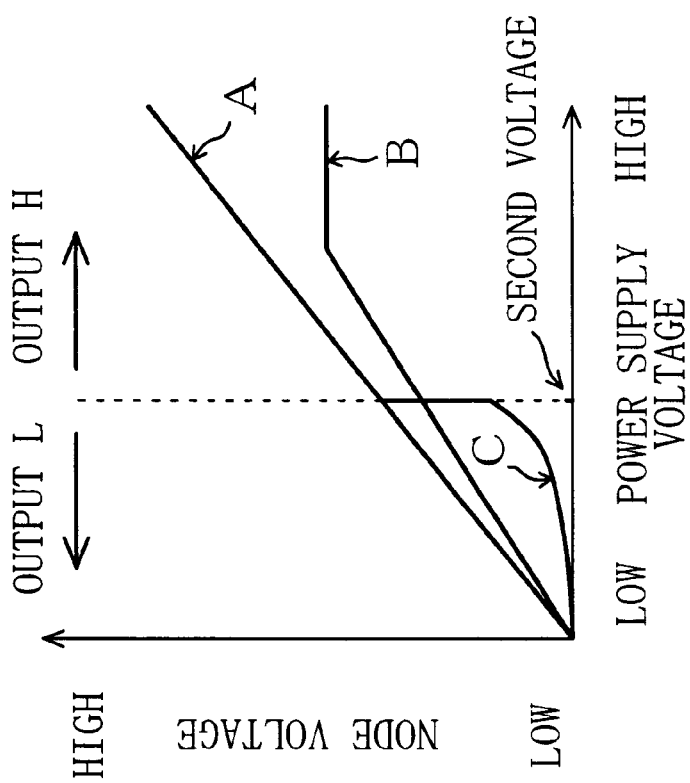
FIG. 7A is a graph illustrating an output voltage from a voltage division circuit, a reference voltage from a reference voltage circuit and an input voltage to a comparison circuit in a power supply voltage detection circuit of Embodiment 3 with respect to a gently-rising power supply voltage.
FIG. 7B is a graph illustrating an output voltage from a voltage division circuit, a reference voltage from a reference voltage circuit and an input voltage to a comparison circuit in the power supply voltage detection circuit with respect to a sharply-rising power supply voltage.
Figure 7:
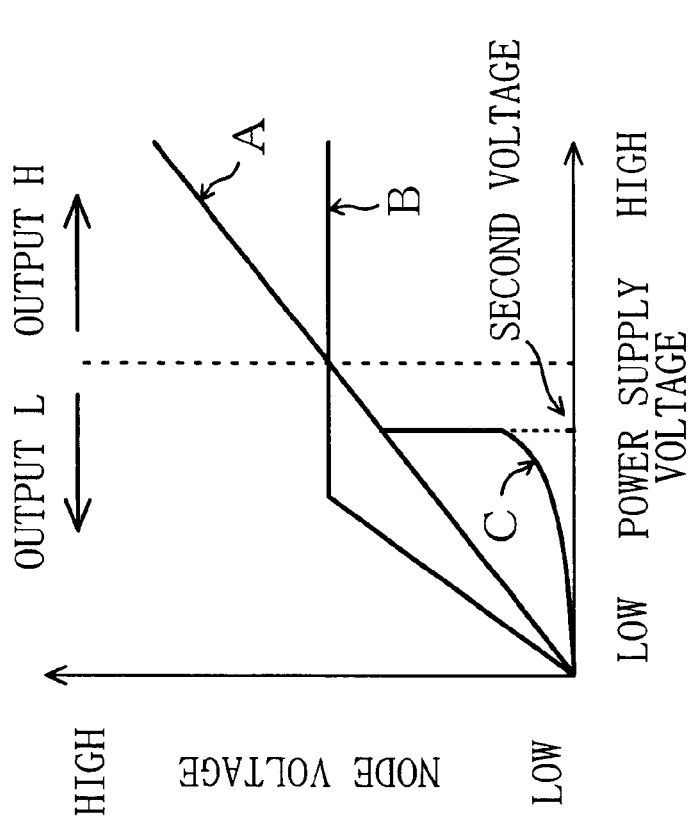

On the other hand, in a case where the power supply voltage rises sharply, as illustrated in FIG. 7B, the output voltage A rises without crossing the reference voltage B. In such a case, a conventional configuration would always output the high signal H. In contrast, with the present embodiment, the rise of the input voltage C from the voltage division circuit 30 to the comparison circuit 32 is delayed by the signal delay circuit 50, whereby the input voltage C rises with the waveform thereof crossing the waveform of the reference voltage B. Therefore, it is ensured that the power supply voltage detection circuit 3 outputs the low signal L until the input voltage C reaches the reference voltage B, while outputting the high signal H after the input voltage C has increased above the reference voltage B.

During the fall of the power supply voltage, the power supply voltage starts decreasing from a level higher than the second voltage and thus the delay operation of the signal delay circuit 50 is canceled by the delay cancellation circuit 51, whereby the output voltage signal from the voltage division circuit 30 is input to the comparison circuit 32 without being delayed, thus maintaining a high response speed as that achieved in the absence of the signal delay circuit 50.

Thus, the present embodiment can provide the same effects as those of Embodiment 1.

Embodiment 4

Figure 8:
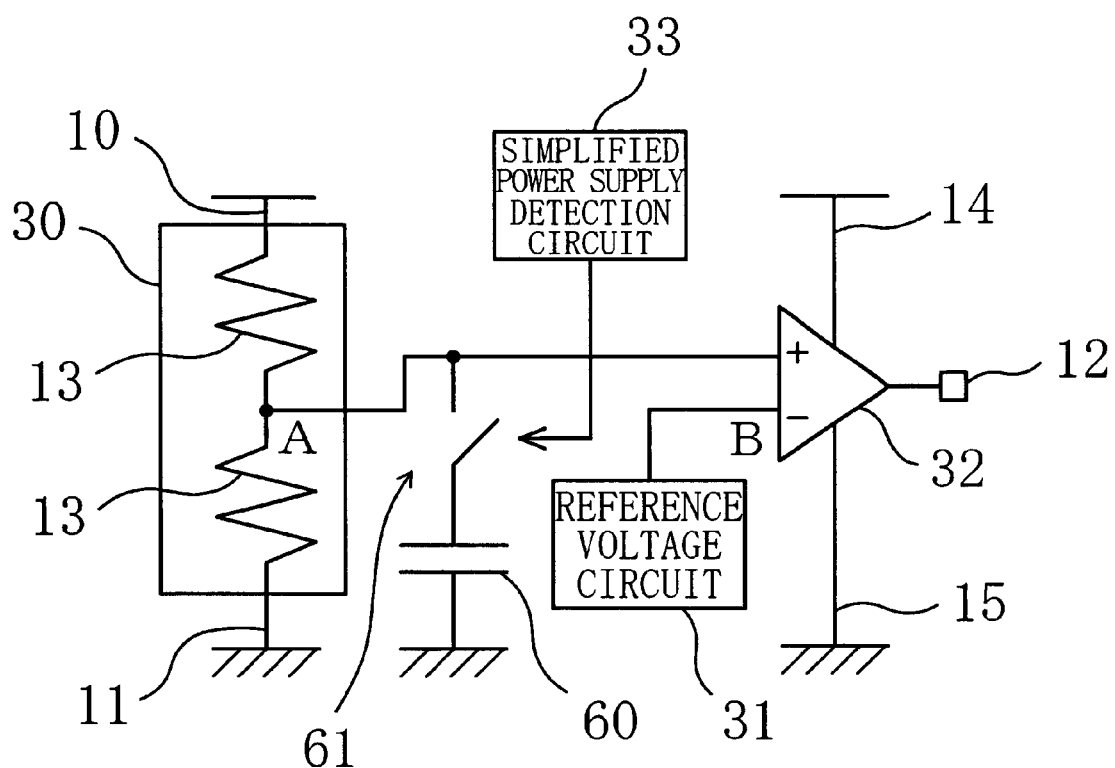
FIG. 8 is a circuit diagram illustrating a general configuration of a power supply voltage detection circuit according to Embodiment 4 of the present invention.

FIG. 8 illustrates a general configuration of the power supply voltage detection circuit 3 according to Embodiment 4 of the present invention, wherein those elements that are already introduced in Embodiment 1 will be denoted by the same reference numerals.

The power supply voltage detection circuit 3 of the present embodiment includes a capacitor 60 in place of the signal cancellation circuit 40 of Embodiment 1 and the signal delay circuit 50 in Embodiment 3. The capacitor 60, as voltage change suppression means, is provided between the output terminal of the voltage division circuit 30 and the ground. The voltage division circuit 30 further includes a switch 61 and a simplified power supply voltage detection circuit 33. The switch 61, as suppression cancellation means, is provided in series with the capacitor 60. The simplified power supply voltage detection circuit 33 is provided for detecting the power supply voltage. The switch 61 is turned ON/OFF by the output from the simplified power supply voltage detection circuit 33.

The simplified power supply voltage detection circuit 33 outputs a signal for turning ON the switch 61 when the power supply voltage is lower than or equal to the second voltage, and acts to output a signal for turning OFF the switch 61 when the power supply voltage is higher than the second voltage. In this way, when the power supply voltage is lower than or equal to the second voltage, the output voltage A from the voltage division circuit 30 changes at a rate that is lower than that of the power supply voltage due to the capacitor 60. On the other hand, when the power supply voltage is higher than the second voltage, the output voltage A changes in proportion to the power supply voltage because the capacitor 60 is inactive.

Figure 9:
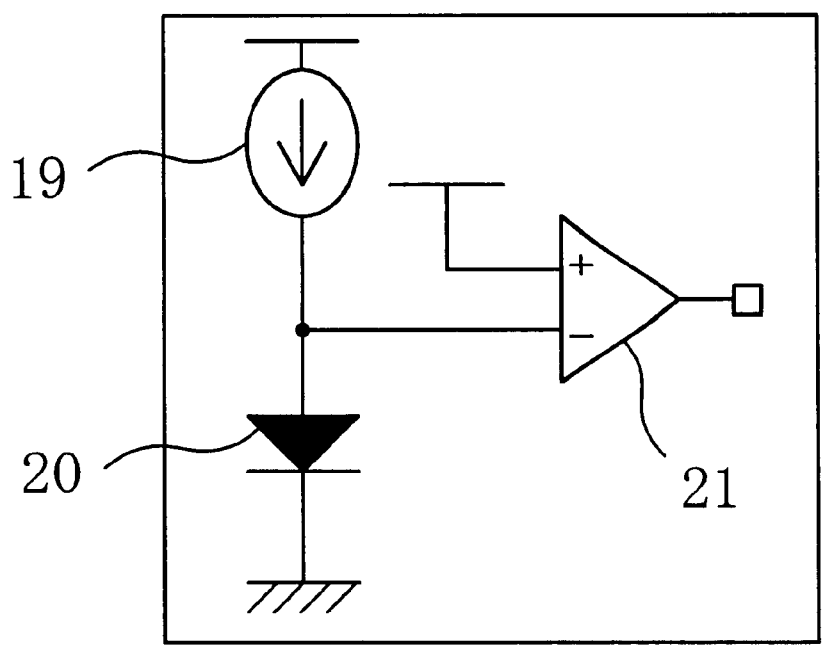
FIG. 9 is a circuit diagram illustrating an exemplary configuration of a simplified power supply voltage detection circuit provided in the power supply voltage detection circuit.

FIG. 9 illustrates a specific example of the simplified power supply voltage detection circuit 33. In the example of FIG. 9, a threshold voltage of a diode 20 is formed from a current source 19 and the diode 20, so that the power supply voltage detection operation is performed by comparing, at a comparator 21, the threshold voltage with the power supply voltage. Since the threshold voltage of the diode 20 is, by nature, decreased by the temperature, the voltage detected by the simplified power supply voltage detection circuit 33 varies depending on the temperature. Nevertheless, such a circuit configuration can be employed because the second voltage does not have to be a constant voltage.

The operation of the power supply voltage detection circuit 3 will be described. During the rise of the power supply voltage, the switch 61 is ON in a region where the power supply voltage is lower than or equal to the second voltage, whereby the rising rate of the output voltage A from the voltage division circuit 30 is lower than the rising rate of the power supply voltage. Therefore, even when the power supply voltage rises sharply, the output voltage A rises slowly with the waveform thereof crossing the waveform of the reference voltage B. Thus, even when the power supply voltage rises sharply, it is possible to ensure that the low signal L is output when appropriate. In a region where the power supply voltage is higher than the second voltage, the high signal H is output, and the output voltage A changes in proportion to the power supply voltage because the switch 61 is OFF.

On the other hand, during the fall of the power supply voltage, the power supply voltage starts decreasing from a level higher than the second voltage and thus the switch 61 is OFF, whereby the output voltage A falls in proportion to the power supply voltage, thus maintaining a high response speed as that achieved in the absence of the capacitor 60. Note that the input voltage C from the voltage division circuit 30 to the comparison circuit 32 is always at the same potential as the output voltage A, in contrast to Embodiments 1 to 3.

Thus, the present embodiment can provide the same effects as those of Embodiment 1.

Embodiment 5

Figure 10:
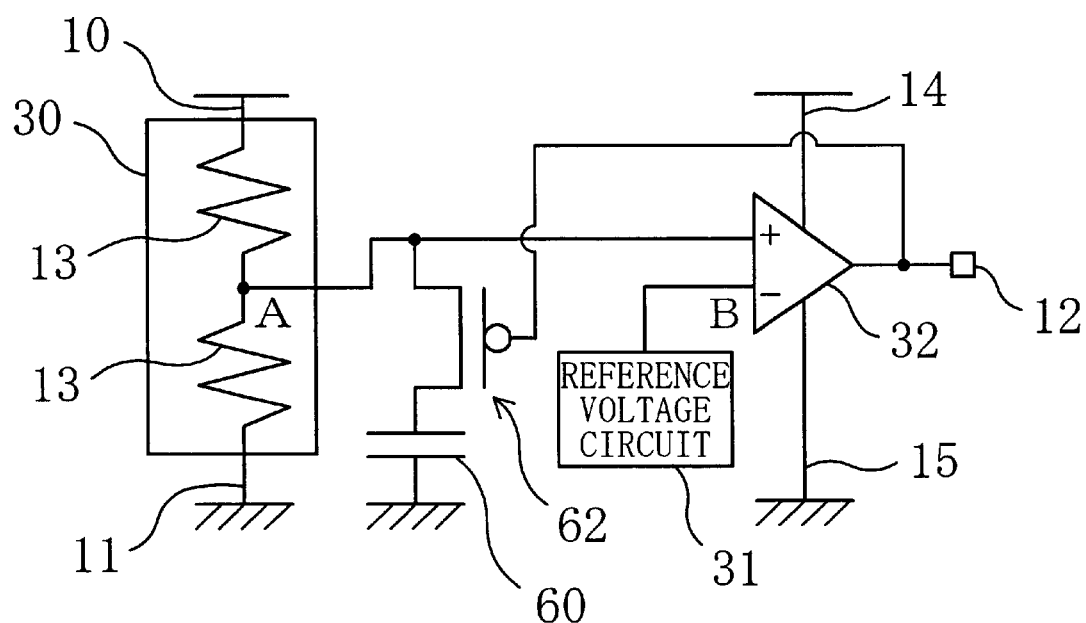
FIG. 10 is a circuit diagram illustrating a general configuration of a power supply voltage detection circuit according to Embodiment 5 of the present invention.

FIG. 10 illustrates a general configuration of the power supply voltage detection circuit 3 according to Embodiment 5 of the present invention, wherein those elements that are already introduced in Embodiment 4 will be denoted by the same reference numerals. The present embodiment is an alternative embodiment to Embodiment 4.

In the present embodiment, the switch 61 of Embodiment 4 is replaced by a PMOS switch 62, and the PMOS switch 62 is turned ON/OFF by using the output of the comparison circuit 32, i.e., the output signal of the power supply voltage detection circuit 3 itself, instead of using the simplified power supply voltage detection circuit 33 as in Embodiment 4.

Specifically, the PMOS switch 62 is turned ON by the low signal L of the power supply voltage detection circuit 3 and turned OFF by the high signal H of the power supply voltage detection circuit 3. By utilizing the fact that while the power supply voltage is still low in the beginning of the rise thereof, the output voltage A and the reference voltage B are equal to each other and thus the power supply voltage detection circuit 3 outputs the low signal L, the low signal L is used to turn ON the PMOS switch 62 to activate the capacitor 60, whereby during the rise of the power supply voltage, the output voltage A from the voltage division circuit 30 rises slowly with the waveform thereof crossing the waveform of the reference voltage B. Thus, even when the power supply voltage rises sharply, it is ensured that the low signal L is output when appropriate. On the other hand, after the output voltage A has increased above the reference voltage B so that the high signal H is output, the high signal H is used to turn OFF the PMOS switch 62 to inactivate the capacitor 60 so that the input voltage C changes in proportion to the power supply voltage, thus maintaining a high response speed during the fall of the power supply voltage.

Figure 11:
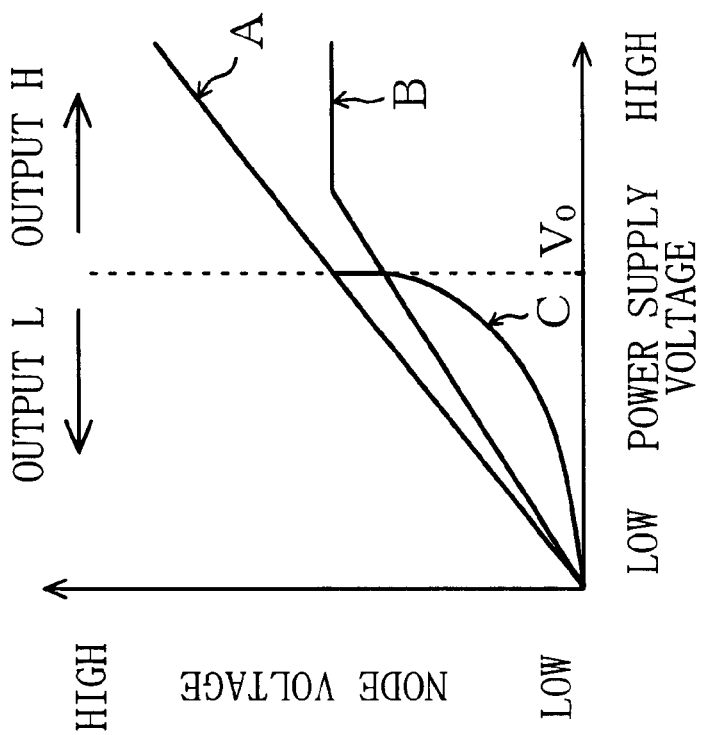
FIG. 11A is a graph illustrating an output voltage from a voltage division circuit, a reference voltage from a reference voltage circuit and an input voltage to a comparison circuit in a power supply voltage detection circuit of Embodiment 5 with respect to a gently-rising power supply voltage.
FIG. 11B is a graph illustrating an output voltage from a voltage division circuit, a reference voltage from a reference voltage circuit and an input voltage to a comparison circuit in the power supply voltage detection circuit with respect to a sharply-rising power supply voltage.
Figure 11:
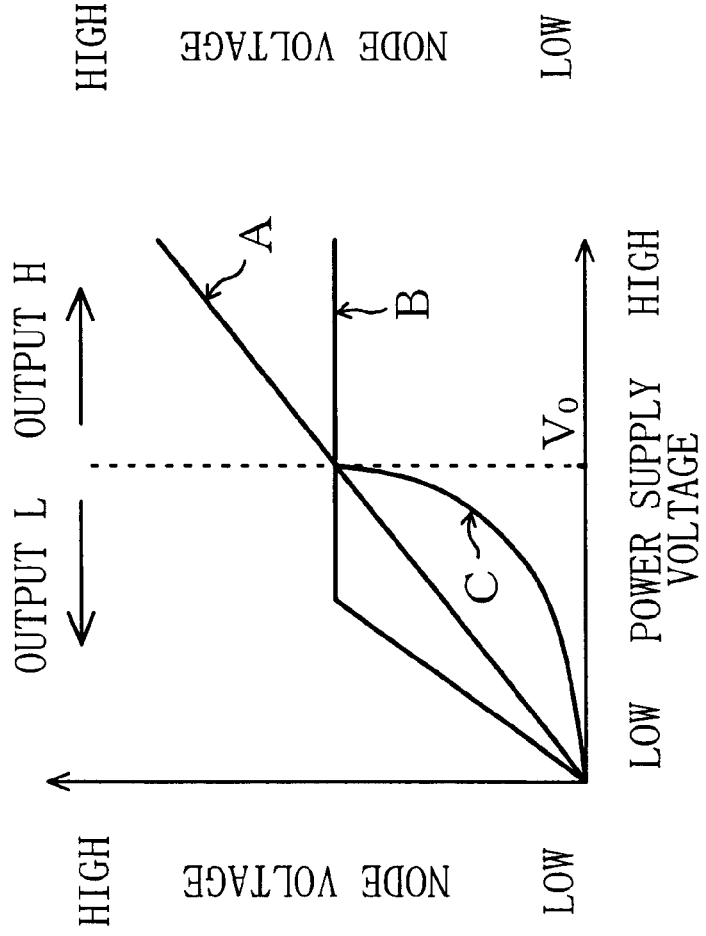

FIG. 11A illustrates the output voltage A and the reference voltage B in a case where the power supply voltage rises gently, while FIG. 11B illustrates the voltages A and B in a case where the power supply voltage rises sharply.

Thus, the present embodiment can provide the same effects as those of Embodiment 1.

Embodiment 6

Figure 12:
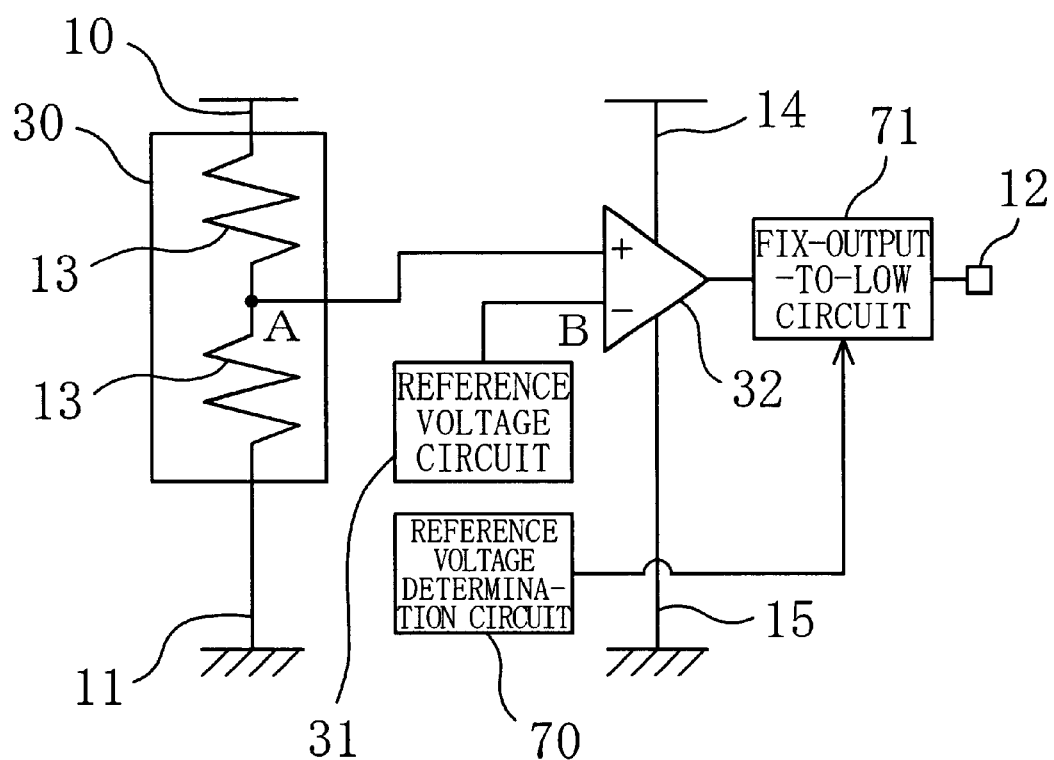
FIG. 12 is a circuit diagram illustrating a general configuration of a power supply voltage detection circuit according to Embodiment 6 of the present invention.

FIG. 12 illustrates a general configuration of the power supply voltage detection circuit 3 according to Embodiment 6 of the present invention, wherein those elements that are already introduced in Embodiment 1 will be denoted by the same reference numerals.

The power supply voltage detection circuit 3 of the present embodiment includes a reference voltage determination circuit 70 for determining whether or not the reference voltage circuit 31 is in a stable state, instead of the signal cancellation circuit 40 of Embodiment 1, the signal delay circuit 50 of Embodiment 3, and the capacitor 60 of Embodiments 4 and 5. The power supply voltage detection circuit 3 of the present embodiment further includes a fix-output-to-low circuit 71, as output fixing means, for forcibly fixing the output signal of the power supply voltage detection circuit 3 to the low signal L based on the output from the reference voltage determination circuit 70.

Figure 13:
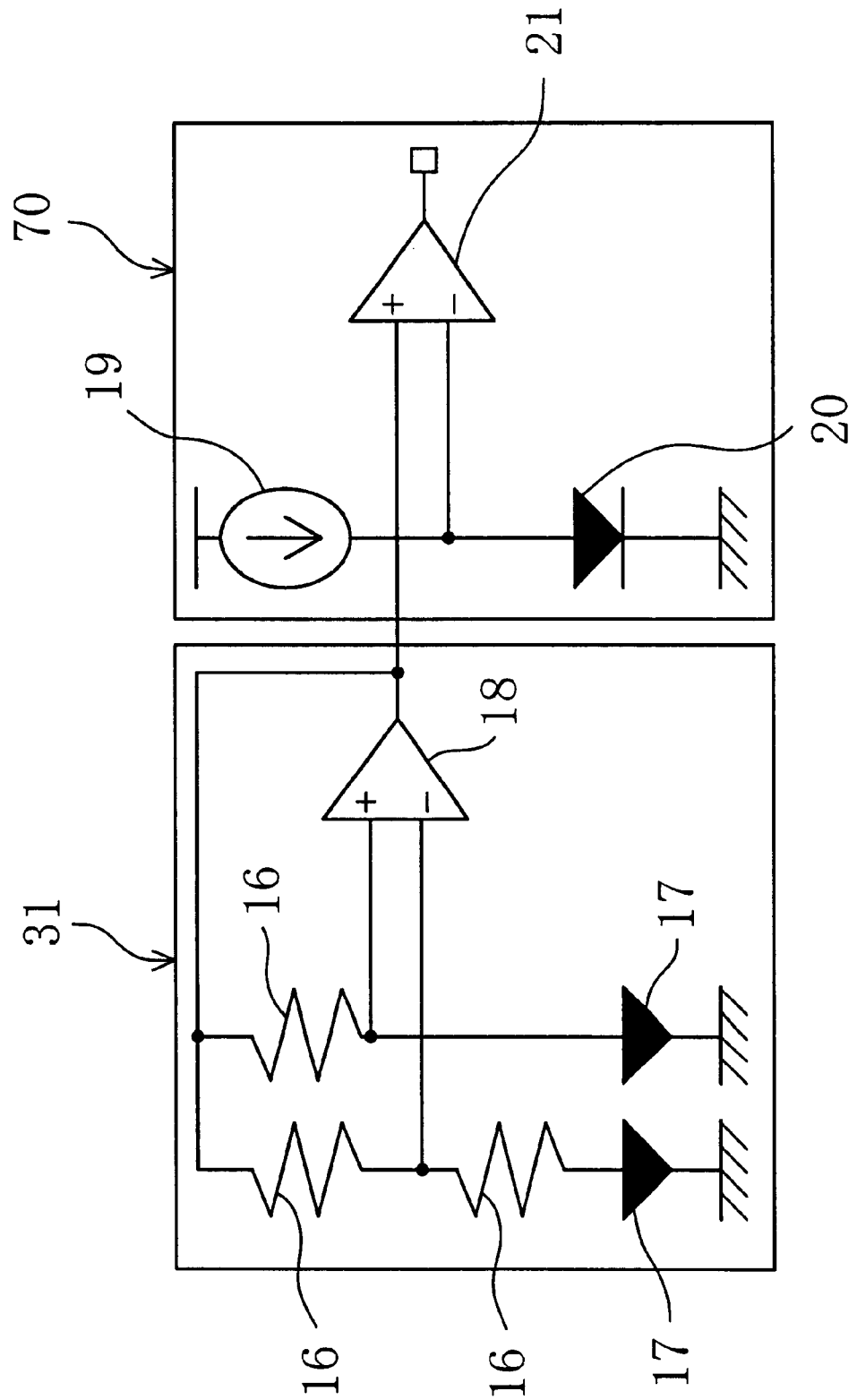
FIG. 13 is a circuit diagram illustrating an exemplary configuration of a reference voltage circuit and that of a reference voltage determination circuit according to Embodiment 6 of the present invention.

When the reference voltage determination circuit 70 determines that the reference voltage B is in an unstable state where it is inconstant with respect to the power supply voltage, the reference voltage determination circuit 70 outputs a 'reference unstable' signal to the fix-output-to-low circuit 71, whereas when it is determined that the reference voltage B is in a stable state where it is constant with respect to the power supply voltage, the reference voltage determination circuit 70 outputs a 'reference stable' signal to the fix-output-to-low circuit 71. FIG. 13 illustrates a specific example of the reference voltage determination circuit 70 as described above. In the example of FIG. 13, a threshold voltage of t he diode 20 is formed from the current source 19 and the diode 20, so that the stability of the reference voltage B is determined by comparing, at the comparator 21, the threshold voltage of the diode 20 with the reference voltage B from the reference voltage circuit 31.

The fix-output-to-low circuit 71 is provided between the output terminal of the comparison circuit 32 and the output terminal 12 of the power supply voltage detection circuit 3. When the reference voltage determination circuit 70 outputs the 'reference unstable' signal, the fix-output-to-low circuit 71 forcibly fixes the output of the power supply voltage detection circuit 3 to the low signal L, whereas when the reference voltage determination circuit 70 outputs the 'reference stable' signal, the output from the comparison circuit 32 is used, as it is, as the output of the power supply voltage detection circuit 3.

Figure 14A:
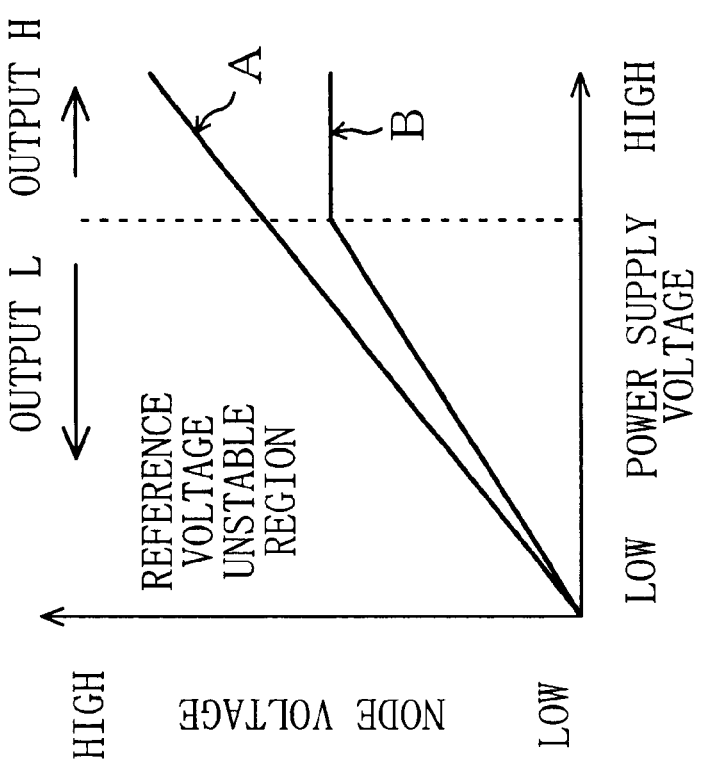
FIG. 14A is a graph illustrating an output voltage from a voltage division circuit, a reference voltage from a reference voltage circuit and an input voltage to a comparison circuit in a power supply voltage detection circuit of Embodiment 6 with respect to a gently-rising power supply voltage.

The operation of the power supply voltage detection circuit 3 having such a configuration will be described with reference to FIG. 14A and FIG. 14B. During the rise of the power supply voltage, in a region where the power supply voltage is low, the reference voltage B is in an unstable state, as illustrated in FIG. 14A. Therefore, the reference voltage determination circuit 70 outputs the 'reference unstable' signal, whereby the fix-output-to-low circuit 71 forcibly fixes the output of the power supply voltage detection circuit 3 to the low signal L. Thus, even when the power supply voltage rises sharply, the low signal L is output when appropriate. Even when the power supply voltage rises gently, the output voltage A may rise over, without crossing, the reference voltage B due to an unstable state of the reference voltage B. In such a case, a conventional configuration would erroneously output the high signal H even though the power supply voltage is lower than or equal to the first voltage. In contrast, the present embodiment avoids such a problem by fixing the output to the low signal L while the reference voltage B is in the unstable region.

Then, after the reference voltage B has entered a stable state, the reference voltage determination circuit 70 outputs the 'reference stable' signal, whereby the fix-output-to-low circuit 71 outputs the comparison result from the comparison circuit 32, as it is, as the output signal of the power supply voltage detection circuit 3. With the reference voltage B being stable, in a region where the output voltage A from the voltage division circuit 30 is still lower than the reference voltage B, the power supply voltage detection circuit 3 outputs the low signal L according to the comparison result from the comparison circuit 32. In a region where the output voltage A from the voltage division circuit 30 is higher than the reference voltage B, the power supply voltage detection circuit 3 outputs the high signal H according to the comparison result from the comparison circuit 32.

Figure 14B:
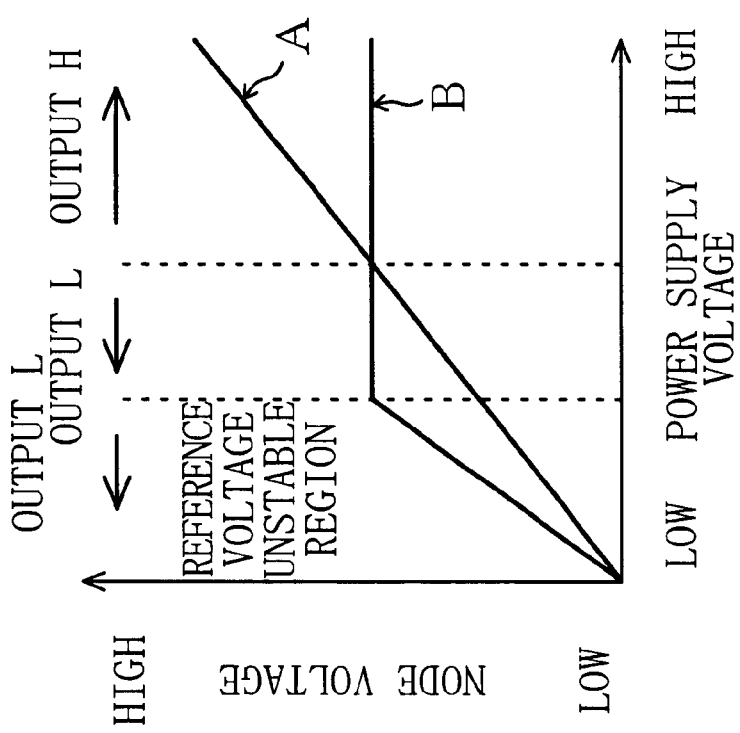
FIG. 14B is a graph illustrating an output voltage from a voltage division circuit, a reference voltage from a reference voltage circuit and an input voltage to a comparison circuit in the power supply voltage detection circuit with respect to a sharply-rising power supply voltage.

On the other hand, when the power supply voltage rises sharply, the output voltage A rises over, without crossing, the reference voltage B, thus forming no intersection between the waveforms thereof, as illustrated in FIG. 14B. In such a case, a conventional configuration would always output the high signal H according to the comparison result from the comparison circuit 32. In contrast, in the present embodiment, the output signal is forcibly fixed to the low signal L in a region where the reference voltage B is unstable during the rise of the power supply voltage, thereby ensuring that the low signal L is output when appropriate.

When the power supply voltage falls, the comparison circuit 32 is already in a stable state, whereby the output from the comparison circuit 32 is used as the output of the power supply voltage detection circuit 3, thus maintaining a high response speed as that achieved in the absence of the fix-output-to-low circuit 71.

As described above, the present embodiment utilizes the fact that there is always a region where the reference voltage B is unstable while the power supply voltage is still low. Specifically, the output is fixed to the low signal L when the reference voltage B is in the unstable region, whereas the output from the comparison circuit 32 is used, as it is, as the output of the power supply voltage detection circuit 3 when the reference voltage B is in the stable region. Therefore, even when the power supply voltage rises sharply, it is possible to ensure that the low signal L is output when appropriate, while maintaining a high response speed during the fall of the power supply voltage.

Furthermore, according to the present embodiment, even when the power supply voltage rises gently, it is possible to prevent the high signal H from being erroneously output due to an unstable state of the reference voltage B that causes the output voltage A to rise over, without crossing, the reference voltage B.

Embodiment 7

Figure 15:
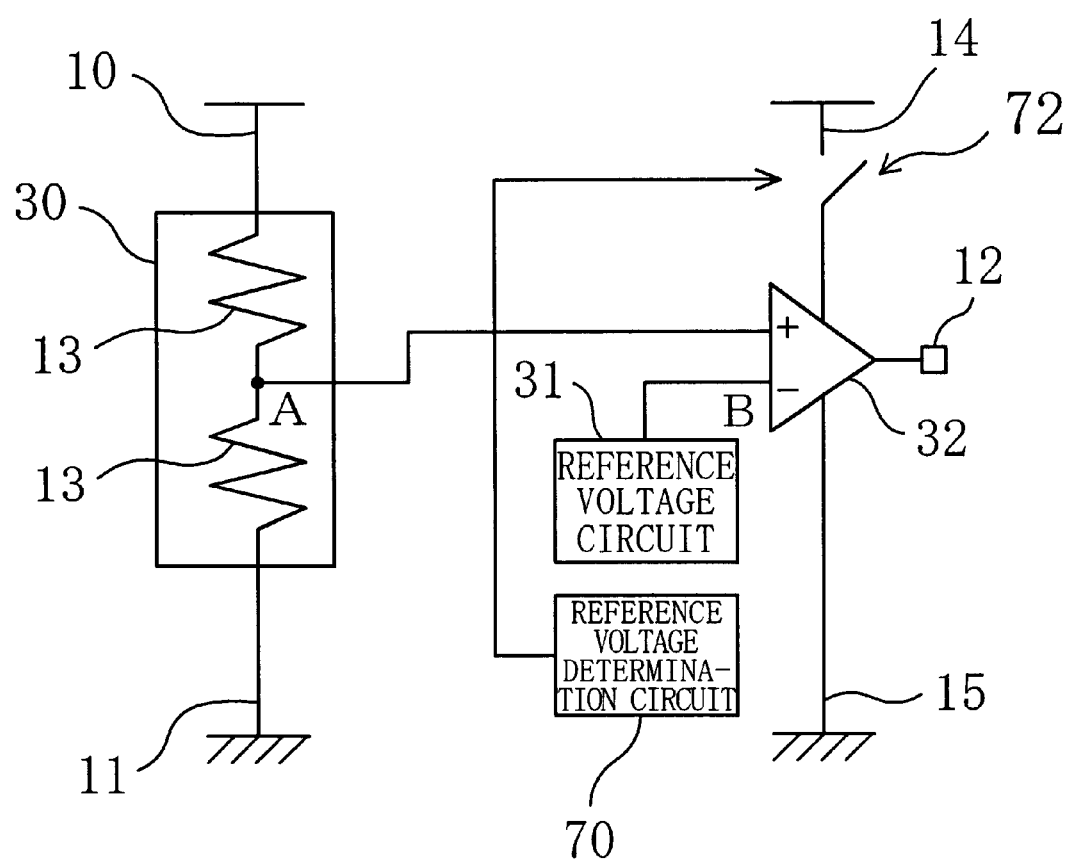
FIG. 15 is a circuit diagram illustrating a general configuration of a power supply voltage detection circuit according to Embodiment 7 of the present invention.

FIG. 15 illustrates a general configuration of the power supply voltage detection circuit 3 according to Embodiment 7 of the present invention, wherein those elements that are already introduced in Embodiment 6 will be denoted by the same reference numerals. The present embodiment is an alternative embodiment to Embodiment 6.

In the present embodiment, a switch 72, as output fixing means, is provided between the comparison circuit 32 and the power supply terminal 14 of the comparison circuit 32, instead of the fix-output-to-low circuit 71 of Embodiment 6. The switch 72 is turned ON/OFF based on the determination result from the reference voltage determination circuit 70. Specifically, the switch 72 is turned OFF by the 'reference unstable' signal from the reference voltage determination circuit 70, and ON by the 'reference stable' signal from the reference voltage determination circuit 70.

The operation of the power supply voltage detection circuit 3 having such a configuration will be described. When the reference voltage B is in the unstable region, the switch 72 is OFF, thereby inactivating the comparison circuit 32 and pulling down the output thereof. Thus, the output of the power supply voltage detection circuit 3 is fixed to the low signal L. When the reference voltage B is in the stable region, the switch 72 is turned ON, thereby operating the comparison circuit 32 to compare the output voltage A with the reference voltage B and output the comparison result.

Thus, the present embodiment can provide the same effects as those of Embodiment 6.

Embodiment 8

Figure 16:
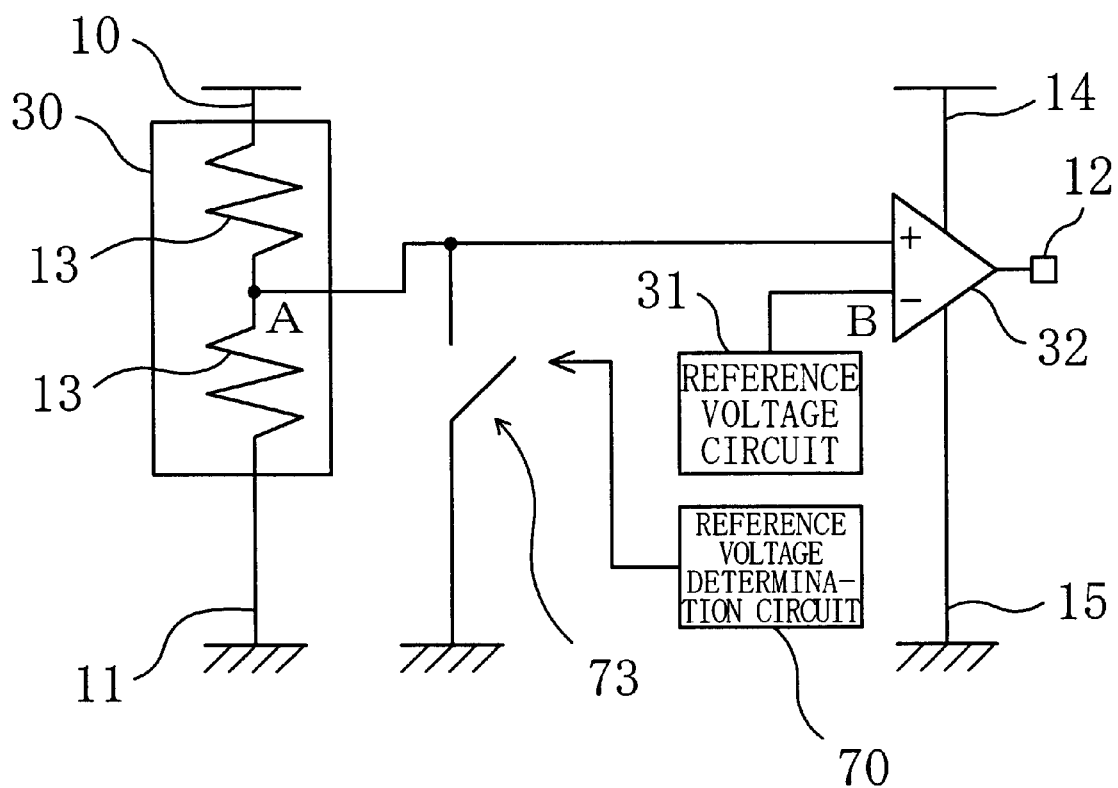
FIG. 16 is a circuit diagram illustrating a general configuration of a power supply voltage detection circuit according to Embodiment 8 of the present invention.

FIG. 16 illustrates a general configuration of the power supply voltage detection circuit 3 according to Embodiment 8 of the present invention, wherein those elements that are already introduced in Embodiment 6 will be denoted by the same reference numerals. The present embodiment is an alternative embodiment to Embodiments 6 and 7.

In the present embodiment, a switch 73, as output fixing means, is provided between the output terminal of the voltage division circuit 30 and the ground, instead of the fix-output-to-low circuit 71 of Embodiment 6. The switch 73 is turned ON/OFF based on the determination result from the reference voltage determination circuit 70. Specifically, the switch 73 is turned ON by the 'reference unstable' signal from the reference voltage determination circuit 70, and turned OFF by the 'reference stable' signal from the reference voltage determination circuit 70.

Figure 17A:
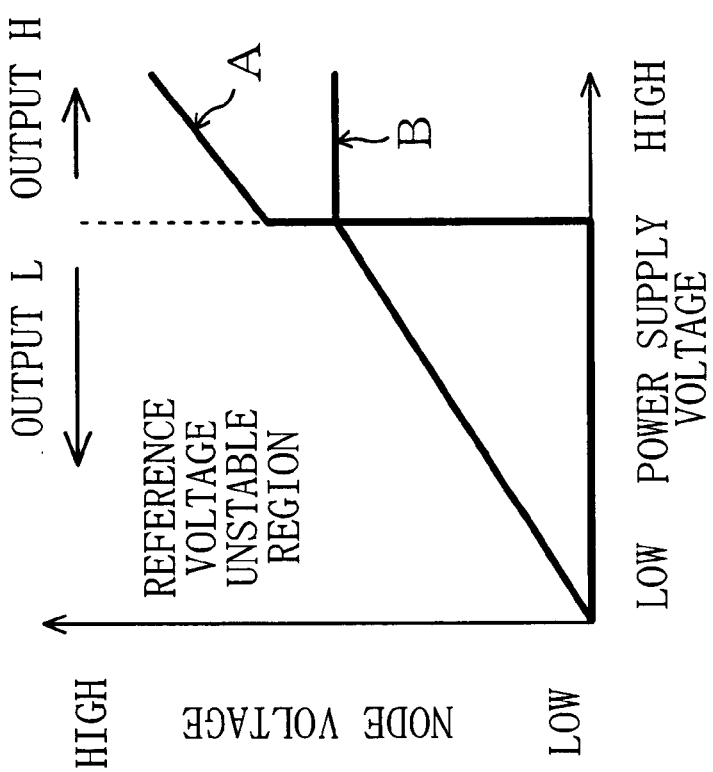
FIG. 17A is a graph illustrating an output voltage from a voltage division circuit, a reference voltage from a reference voltage circuit and an input voltage to a comparison circuit in a power supply voltage detection circuit of Embodiment 8 with respect to a gently-rising power supply voltage.
Figure 17B:
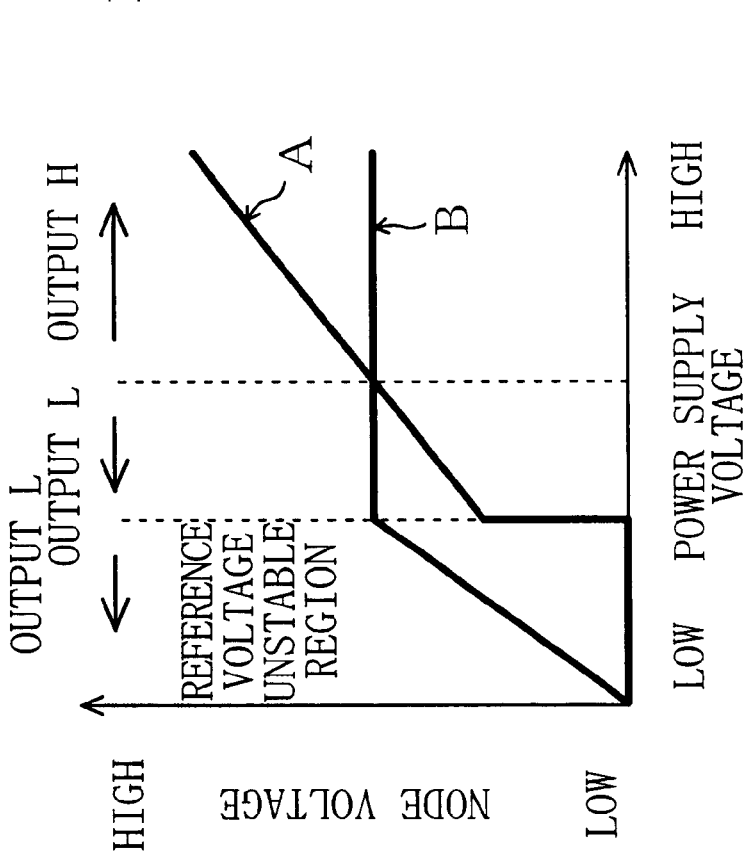
FIG. 17B is a graph illustrating an output voltage from a voltage division circuit, a reference voltage from a reference voltage circuit and an input voltage to a comparison circuit in the power supply voltage detection circuit with respect to a sharply-rising power supply voltage.

The operation of the power supply voltage detection circuit 3 having such a configuration will be described with reference to FIG. 17A and FIG. 17B. When the reference voltage B is in the unstable region, the switch 73 is ON, whereby the output terminal of the voltage division circuit 30 is connected to the ground. In this way, irrespective of whether the output voltage A from the voltage division circuit 30 rises gently, as illustrated in FIG. 17A, or sharply, as illustrated in FIG. 17B, the output voltage A is suppressed to the ground potential, thereby fixing the output signal from the power supply voltage detection circuit 3 to the low signal L, in the reference voltage unstable region. On the other hand, when the reference voltage B is in the stable region, the switch 73 is OFF, whereby the output voltage A changes in proportion to the power supply voltage as in the prior art. Therefore, the power supply voltage detection circuit 3 operates normally to output a signal according to the result of the comparison at the comparison circuit 32 between the output voltage A and the reference voltage B.

Thus, the present embodiment can provide the same effects as those of Embodiment 6.

Embodiment 9

Figure 18:
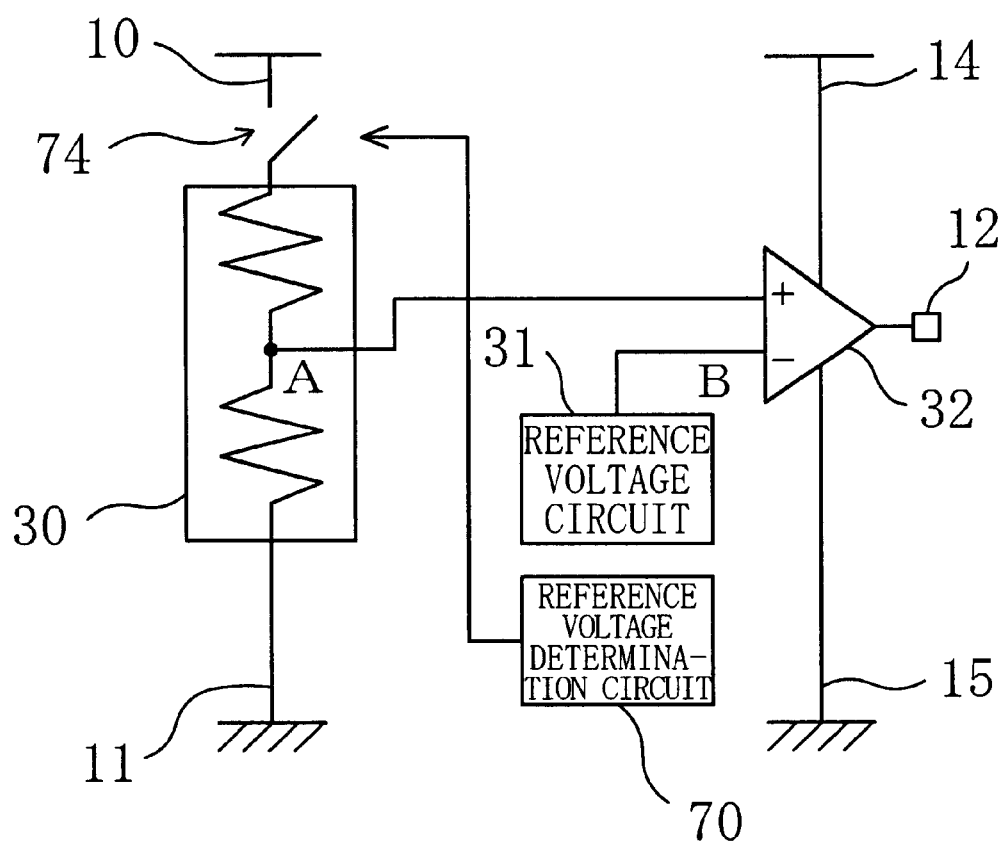
FIG. 18 is a circuit diagram illustrating a general configuration of a power supply voltage detection circuit according to Embodiment 9 of the present invention.
Figure 19:
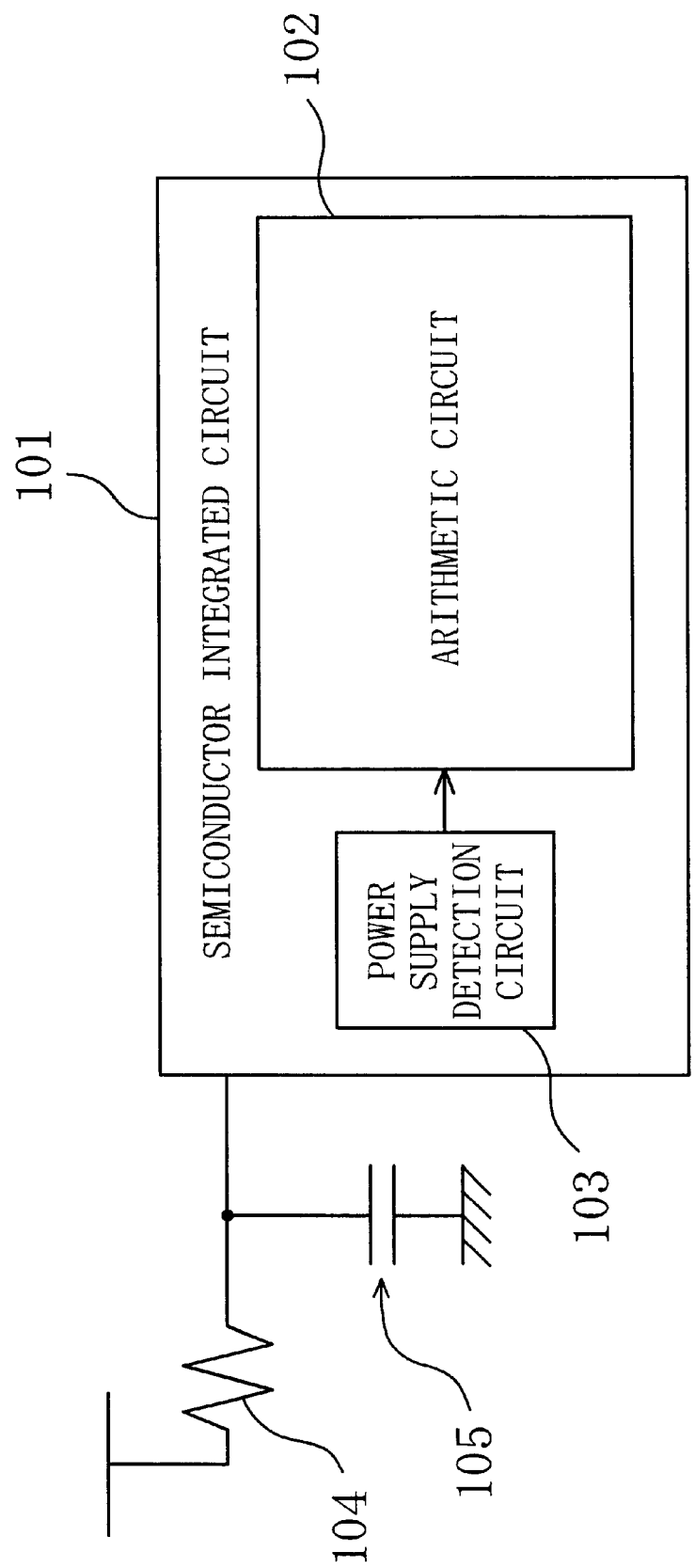
FIG. 19 is a circuit diagram illustrating a configuration of a semiconductor integrated circuit incorporating a conventional power supply voltage detection circuit that is provided with a resistor and a capacitor as external components.
Figure 20:
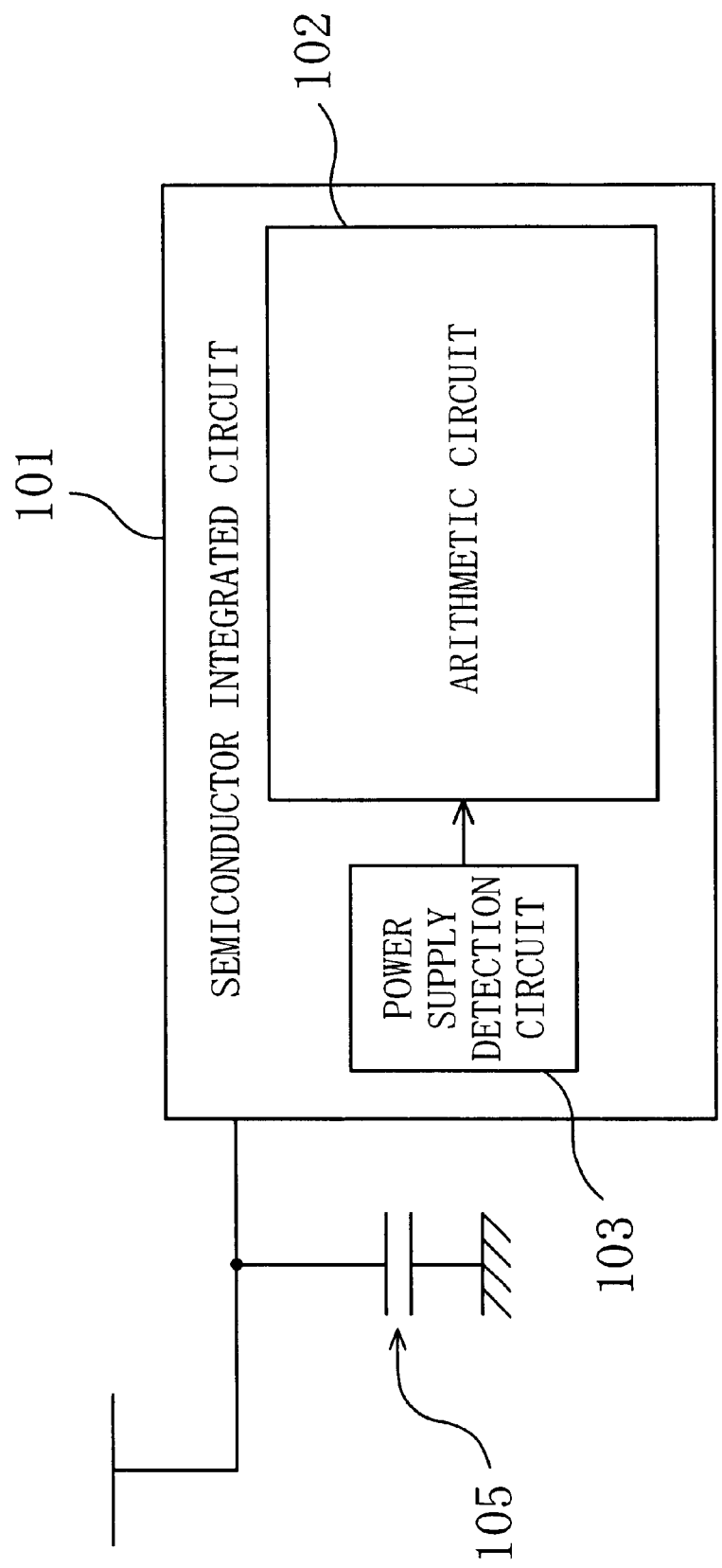
FIG. 20 is a circuit diagram illustrating a configuration of a semiconductor integrated circuit incorporating a conventional power supply voltage detection circuit that is provided with a capacitor having a large capacitance as an external component.
Figure 21:
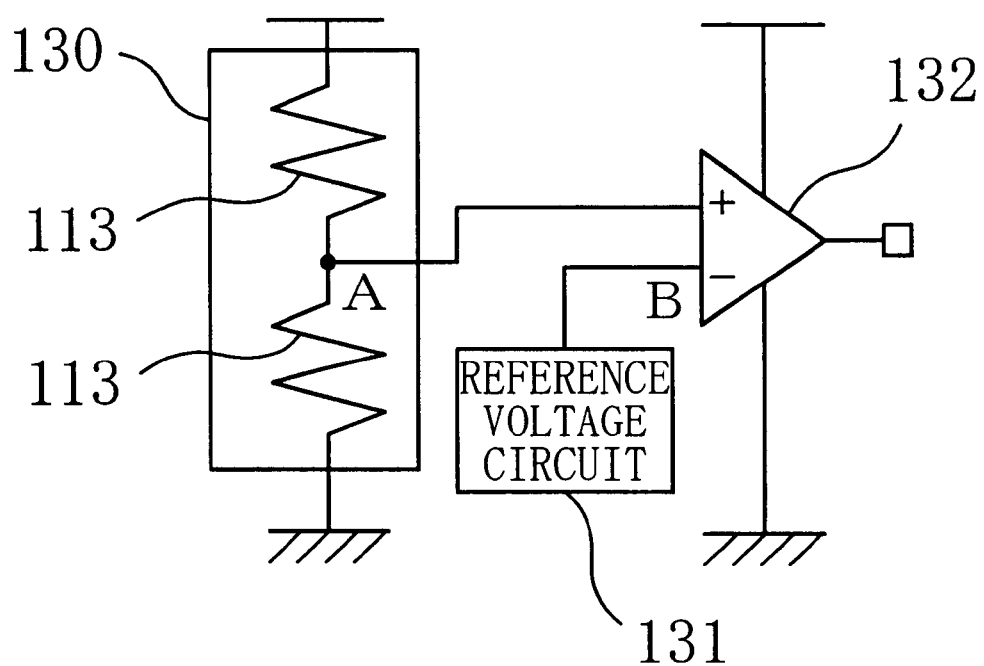
FIG. 21 corresponds to FIG. 1 and illustrates a general configuration of a conventional power supply voltage detection circuit.
Figure 22A:
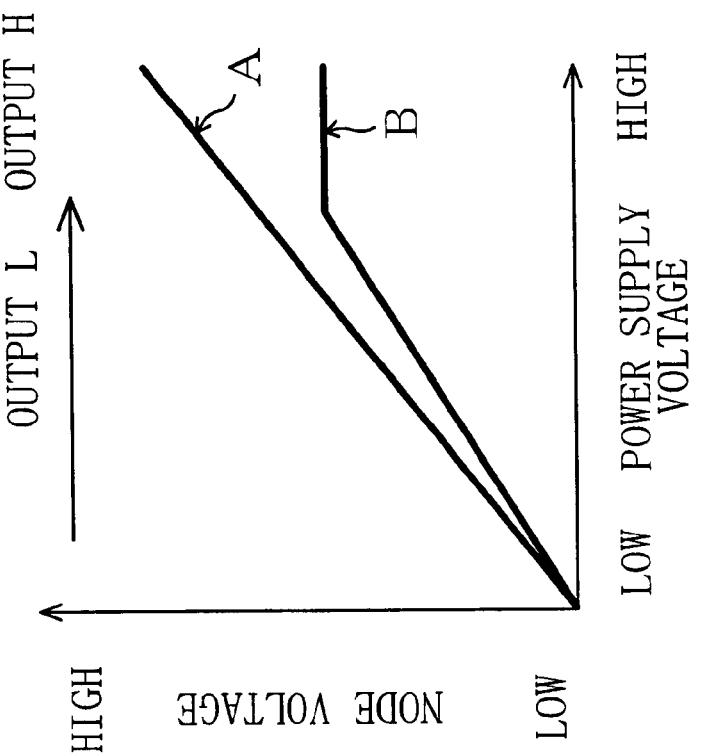
FIG. 22A is a graph illustrating an output voltage from a voltage division circuit, a reference voltage from a reference voltage circuit and an input voltage to a comparison circuit in a conventional power supply voltage detection circuit with respect to a gently-rising power supply voltage.
Figure 22B:
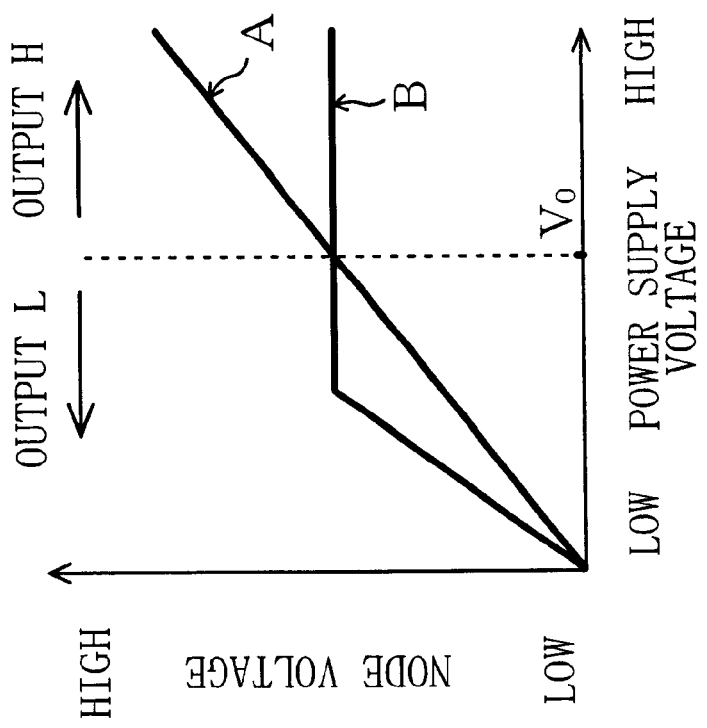
FIG. 22B is a graph illustrating an output voltage from a voltage division circuit, a reference voltage from a reference voltage circuit and an input voltage to a comparison circuit in the power supply voltage detection circuit with respect to a sharply-rising power supply voltage.

FIG. 18 illustrates a general configuration of the power supply voltage detection circuit 3 according to Embodiment 9 of the present invention, wherein those elements that are already introduced in Embodiment 6 will be denoted by the same reference numerals. The present embodiment is an alternative embodiment to Embodiments 6 to 8.

In the present embodiment, a switch 74, as output fixing means, is provided between the power supply terminal and the voltage division circuit 30, instead of the fix-output-to-low circuit 71 of Embodiment 6. The switch 74 is turned ON/OFF based on the determination result from the reference voltage determination circuit 70.

Specifically, the switch 74 is turned OFF by the 'reference unstable' signal from the reference voltage determination circuit 70. Therefore, the output voltage A from the voltage division circuit 30 is pulled down via the ground terminal 11, thereby fixing the output of the power supply voltage detection circuit 3 to the low signal L. The switch 74 is turned ON by the 'reference stable' signal from the reference voltage determination circuit 70, whereby the power supply voltage detection circuit 3 operates normally.

Thus, the present embodiment can provide the same effects as those of Embodiment 6.

What is claimed is:

1. A power supply voltage detection circuit for outputting a signal upon detecting that a power supply voltage, which is a potential difference between a first power supply and a second power supply, is equal to or higher than a predetermined first voltage, the power supply voltage detection circuit comprising:

a voltage division circuit for linearly dividing the power supply voltage, which is the potential difference between the first power supply and the second power supply, so as to output a signal of an output voltage, which is a voltage at the division point with respect to the second power supply;

a reference voltage circuit for outputting a signal of a reference voltage, which is defined to be equal to the output voltage from the voltage division circuit when the power supply voltage is equal to the first voltage;

a comparison circuit for comparing an input voltage, which is a voltage of the output voltage signal received from the voltage division circuit, with the reference voltage of the reference voltage signal received from reference voltage circuit; and signal cancellation means, having a predetermined second voltage, for canceling an input of the output voltage signal from the voltage division circuit to the comparison circuit when the power supply voltage is lower than the second voltage, while not canceling the input of the output voltage signal when the power supply voltage is higher than the second voltage.

2. The power supply voltage detection circuit of claim 1, wherein:

the power supply voltage detection circuit determines that the power supply voltage is not detected when the input voltage from the voltage division circuit to the comparison circuit is lower than or equal to the reference voltage from the reference voltage circuit, while determining that the power supply voltage is detected when the input voltage is higher than the reference voltage; and the signal cancellation means is a PMOS transistor provided between the voltage division circuit and the comparison circuit, the PMOS transistor including a source terminal connected to an output terminal of the voltage division circuit, a drain terminal connected to one of input terminals of the comparison circuit that is provided for the voltage division circuit, and a gate terminal connected to a power supply such that a threshold voltage of the PMOS transistor corresponds to the second voltage.

3. A power supply voltage detection method for detecting a power supply voltage equal to or higher than a predetermined first voltage, the method comprising:

a first step of outputting a reference voltage corresponding to the power supply voltage being equal to the first voltage;

a second step of generating a second voltage taking a value corresponding to a value of the power supply voltage;

a third step of canceling the output of the second voltage generated in the second step when the power supply voltage is lower than a predetermined third voltage, and allowing the output of the second voltage generated in the second step and outputting the second voltage as a fourth voltage when the power supply voltage is equal to or higher than the predetermined third voltage; and a fourth step of comparing the fourth voltage output in the third step with the reference voltage output in the first step, and outputting a power supply voltage detection signal when the fourth voltage is equal to or higher than the reference voltage.

4. The power supply voltage detection method of claim 3, wherein the third step, the second voltage generated in the second step is modified, so that the second voltage generated in the second step is cancelled when the power supply voltage is lower than the predetermined third voltage, and when the power supply voltage is equal to or higher than the third voltage, the second voltage is changed and adjusted to be equal to the second voltage and thereafter the second voltage is output as the fourth voltage.

* * * * *